(12) United States Patent
Petrovic

(10) Patent No.: US 8,981,980 B2
(45) Date of Patent: Mar. 17, 2015

(54) METHOD AND APPARATUS FOR BANDPASS DIGITAL TO ANALOG CONVERTER

(75) Inventor: Branislav Petrovic, La Jolla, CA (US)

(73) Assignee: Entropic Communications, Inc., San Diego, CA (US)

( * ) Notice: Subject to any disclaimer, the term of this patent is extended or adjusted under 35 U.S.C. 154(b) by 302 days.

(21) Appl. No.: 13/557,067

(22) Filed: Jul. 24, 2012

(65) Prior Publication Data

US 2012/0300823 A1 Nov. 29, 2012

Related U.S. Application Data

(63) Continuation of application No. 12/571,201, filed on Sep. 30, 2009, now Pat. No. 8,237,595.

(51) Int. Cl.
| | |
|---|---|
| H03M 1/66 | (2006.01) |
| H03M 1/06 | (2006.01) |
| H03M 1/74 | (2006.01) |
| H04L 27/34 | (2006.01) |
| H03M 1/12 | (2006.01) |
| H04L 27/38 | (2006.01) |
| H04B 1/713 | (2011.01) |
| H03F 1/32 | (2006.01) |
| H04B 17/00 | (2006.01) |

(52) U.S. Cl.
CPC ............ *H03M 1/0614* (2013.01); *H03M 1/747* (2013.01); *H04L 27/34* (2013.01); *H03M 1/12* (2013.01); *H04L 27/38* (2013.01); *H04B 1/713* (2013.01); *H03F 1/3247* (2013.01); *H04B 17/0027* (2013.01); *H03M 1/66* (2013.01)
USPC ............................................. 341/144; 455/73

(58) Field of Classification Search
CPC ........ H03M 1/747; H03M 1/12; H04L 27/38; H04L 27/34; H03F 1/3247; H04B 1/713; H04B 17/0027
USPC .......... 341/144, 155; 375/261, 296, 298, 135; 455/73, 20, 85, 118, 78
See application file for complete search history.

(56) References Cited

U.S. PATENT DOCUMENTS

| | | |
|---|---|---|
| RE37,569 E | 3/2002 | Ayanoglu et al. |
| 7,068,730 B2 | 6/2006 | Monta |
| 7,528,754 B1 | 5/2009 | Bakkaloglu |
| 7,714,760 B2 * | 5/2010 | Petrovic ...................... 341/155 |
| 7,924,802 B2 | 4/2011 | Tarighat-Mehrabani et al. |
| 2002/0047942 A1 | 4/2002 | Vorenkamp et al. |
| 2005/0119025 A1 | 6/2005 | Mohindra et al. |
| 2008/0311860 A1 | 12/2008 | Tanaka et al. |
| 2009/0225903 A1 | 9/2009 | van Waasen |

* cited by examiner

*Primary Examiner* — Joseph Lauture
(74) *Attorney, Agent, or Firm* — Richard Bachand

(57) ABSTRACT

Systems and methods for providing a mechanism by which digital signals can be converted to analog signals with an efficient structure that reduces the number of filters required by providing a mechanism for cancelling images that would otherwise be generated. By adjusting three parameters in the system, a selection can be made as to whether to generate upper sidebands, lower sidebands and in which direction the envelope of the output from the system will be skewed.

12 Claims, 15 Drawing Sheets

METHOD AND APPARATUS FOR BANDPASS DIGITAL TO ANALOG CONVERTER

TECHNICAL FIELD

The disclosed system and method relate to the conversion of digital information to analog information. More particularly, the disclosed system and method relate to a digital to analog converter for use with communications systems.

BACKGROUND

Presently, digital communications systems include systems for communicating audio information, video information and other data. These systems include methods for distributing the information over coaxial cable, wireless connections, etc. Some such digital communication systems use digital modulation methods to transmit digital bit-streams in a limited frequency band. The digital information, typically in a form of bit-streams, are initially modulated onto a digital baseband signal, then converted to an analog baseband signal. The analog baseband signal is then converted to a radio frequency (RF) signal, Alternatively, digital information may first be converted to analog information (i.e., an analog baseband signal). The analog baseband signal is then modulated onto an RF carrier. This is typically accomplished by the means of a well known quadrature I, Q modulator. FIG. 1 shows a block diagram of a prior art digital-to-analog converter (DAC) 100 for performing this function.

The DAC system 100 in FIG. 1 receives an in-phase digital signal, I. The system 100 also receives a quadrature-phase digital signal, Q. The digital signals, I and Q take the form of a stream of digital values (or samples) that represent the amplitude of the baseband I and Q signal, respectively, at a series of points in time. The digital sample streams I, Q are converted by DACs 102, 104 to a step-wise function that approximates the analog representation of the baseband signals, I and Q formerly represented by the digital sample streams. The DACs 102, 104 receive a sample clock signal 106 having a sampling frequency, $f_s$. The sample clock signal 106 is generated by a clock generator 108 and an oscillator 110. Ideally, the DACs 102, 104 would exactly recreate the analog signals I and Q. However, the conversion process in the DACs 102, 104 introduces distortion. The distortion is in the form of sin(x)/x (commonly known as the "sine" function). The input baseband signal is multiplied by the sine function in the frequency domain. As such, the DAC output signals 112, 114 have a sine envelope.

In addition to the multiplication by the sine function, the output of the DACs 102, 104 include the spectral images having a frequency equal to the sampling frequency, $f_s$ plus and minus the frequency of the baseband signals I and Q. In addition, spectral images are generated at each harmonic of the sampling frequency $f_s$ plus and minus the baseband frequency. The output 112, 114 of the DACs 102, 104 are upconverted by the means of multiplication in upconverters or mixers 124, 126, typically using quadrature local oscillator (LO) signals 127, 128. The process of multiplication accomplishes both the modulation of the analog baseband signal onto the RF carrier, and upconversion of the baseband signal to the RF carrier frequency. The first local oscillator (LO) signal 127 is generated by an oscillator 130. The second LO signal 128 is generated by a minus 90 degree phase shifter 132. The oscillator 130 is typically independent of the oscillator 110 used to generate the sample clock signal 106 in order to make a greater frequency range of carrier frequencies available. After upconversion, an RF output signal 136 is generated by subtracting the mixer output signal 142 from the mixer output signal 140 using a subtraction device 138.

In addition to fundamental frequency, the LO signals 127 and 128 typically contain harmonic frequencies (or the LO harmonics may be generated inside the mixers in the multiplication process). Often, the LO signal is a square-wave, with strong harmonic content, predominantly of odd-order. If raw, unfiltered DACs output signals 112 and 114 were directly applied to their respective mixers, the spectral images generated by the DACs 102, 104 may be converted by the LO fundamental and its harmonics to the desired frequency and thus interfere with the desired upconverted output from the mixers 124, 126. Furthermore, the prior art DAC system 100 would not be able to generate a single-sideband (SSB) signal, because the cancellation of the other sideband in the subtracting junction 138 would be incomplete due to unwanted converted terms falling on the that sideband, i.e. a residual power would remain in the other (unwanted) sideband. It is well known in the art that the ability to generate SSB signal is essential in order to be able to construct complex RF signals.

In order to prevent spectral contamination and achieve the ability to generate SSB signals (thus any complex signal),low pass anti-aliasing or reconstruction filters (LPRF) 116, 118 are used to reduce or eliminate the undesired spectral images from the DAC output signals 112, 114. However, LPRFs are large and complex, driving up the cost of such DAC systems. In particular, the requisite active filters in LPRFs increase the cost, power and die size of a chip. LPRF filters also present performance difficulties. For example, it is desirable to carefully balance and match the I-channel and Q-channel signal paths. This is made more difficult by the use of LPRFs. Particularly, higher order LPRF filters make balancing and matching the signal paths more difficult. The large LPRFs also compete with design-critical blocks for optimal placement on the die. All of these factors present design challenges that may significantly impact cost and the performance of DAC systems.

It can be seen from the above description that there is a need for techniques to directly generate bandpass signals while avoiding the aforementioned issues of conventional approaches.

SUMMARY

The disclosed method and apparatus provides a mechanism by which digital signals can be converted to analog signals with an efficient structure that reduces the number of filters required by providing a mechanism for canceling images that would otherwise be generated. By adjusting three parameters in the system, a selection can be made as to whether to generate upper sidebands, lower sidebands, a combination of upper and lower sidebands and how the envelope of the output from the system will be skewed.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

Figure 1:
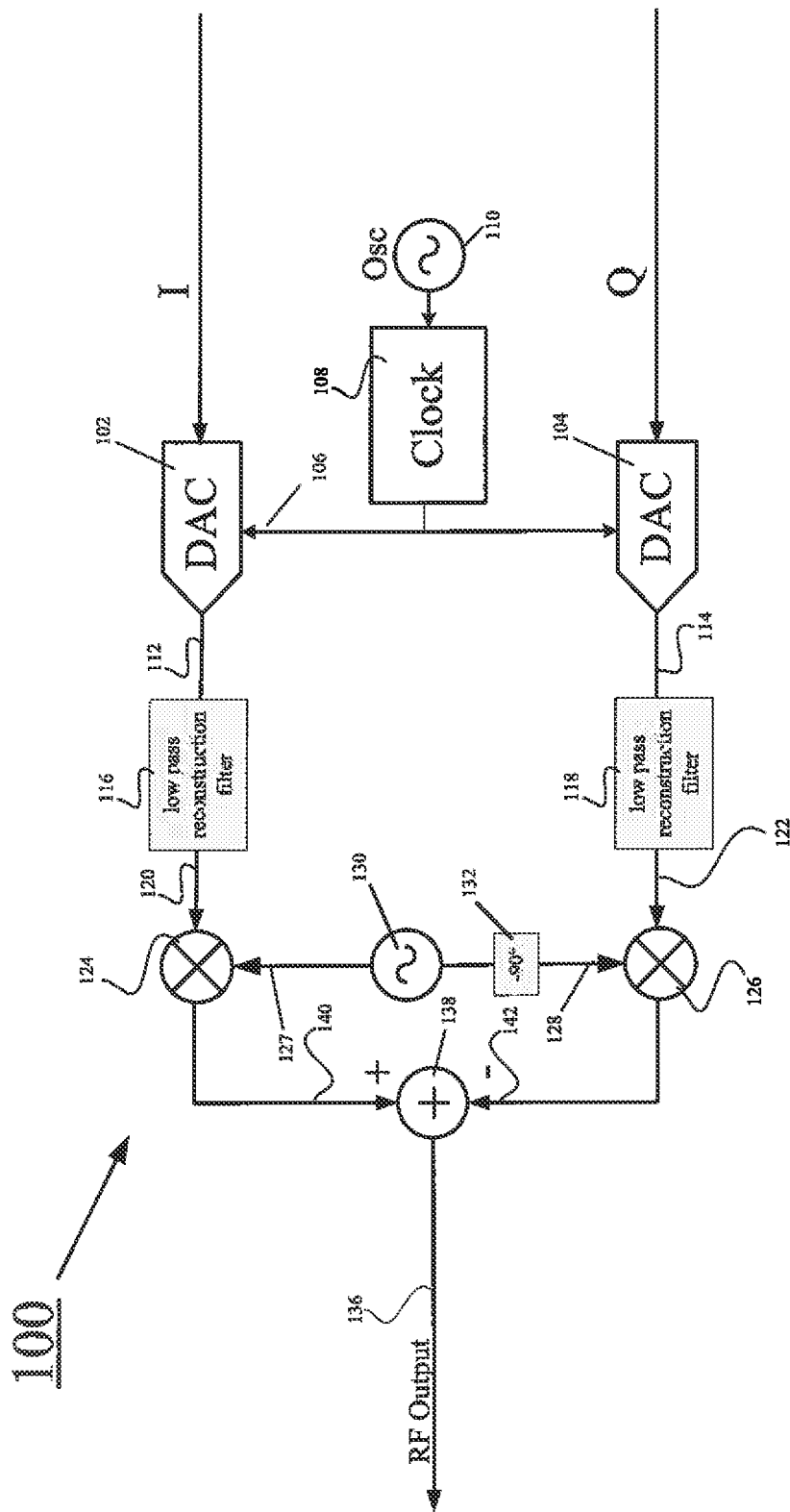
FIG. 1 shows a block diagram of a prior art digital-to-analog converter (DAC).
Figure 2:
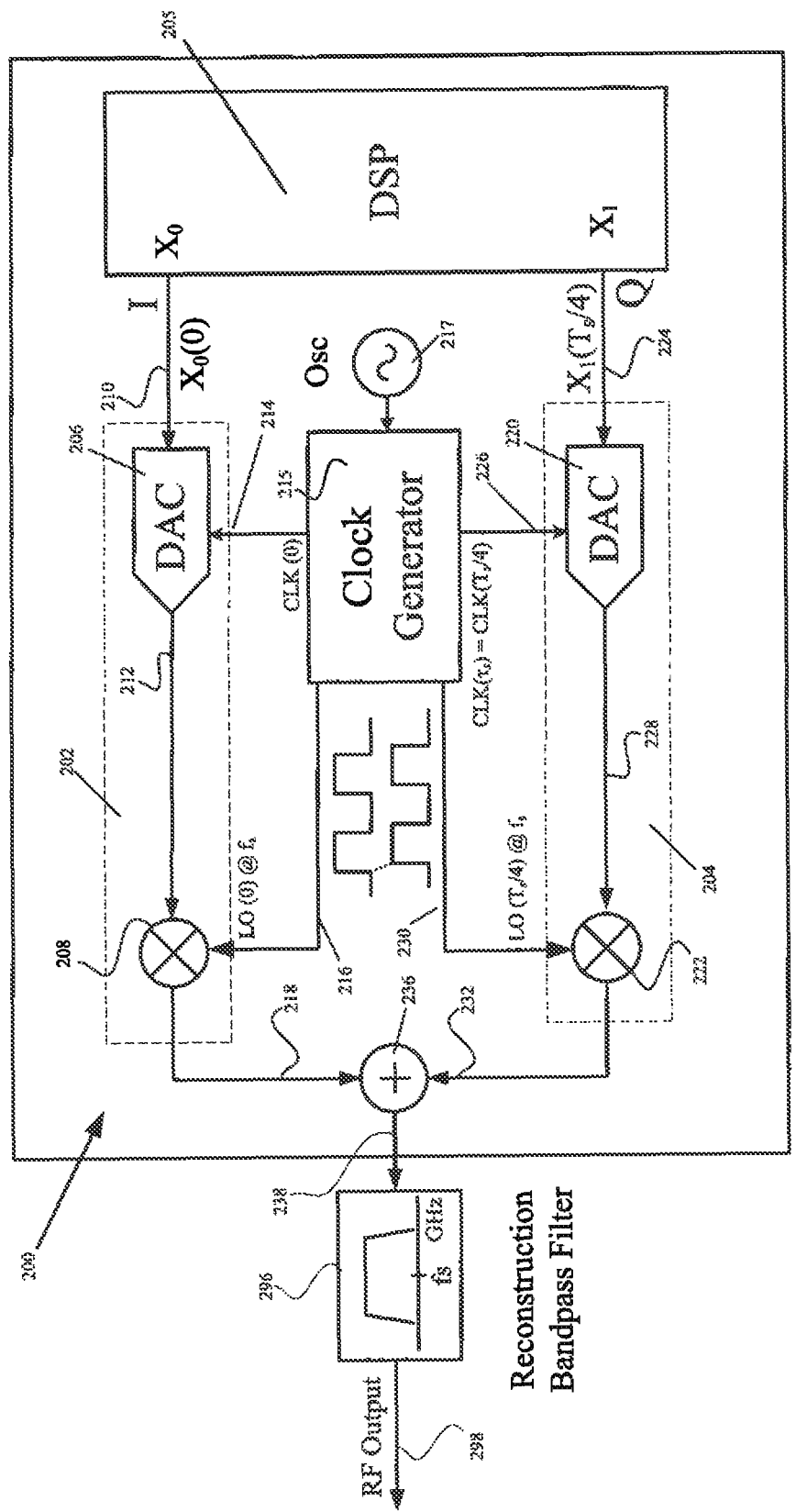
FIG. 2 shows one embodiment of a dual bandpass digital-to-analog converter (DB-DAC) system 200 in accordance with one embodiment of the disclosed method and apparatus.

Structure of a Two Channel DB-DAC System of FIG. 2

FIG. 2 shows one embodiment of a dual bandpass digital-to-analog converter (DB-DAC) system 200 in accordance with one embodiment of the disclosed method and apparatus. The DB-DAC system 200 includes a first channel 202 (hereafter referred to as Channel Zero) and a second channel 204 (hereafter referred to as Channel One). The Channel Zero 202 includes a first DAC 206 and a first mixer 208. The first DAC 206 has a clock input, a signal input and an output. A DSP 205 provides the signal input to the first DAC 206 with a signal 210 comprised of a stream of samples (i.e., digital values that represent the relative amplitude of the signal at particular points in time). The clock input of the DAC 206 also receives a first sample clock signal 214 generated by a clock generator 215. The clock generator 215 is coupled to an oscillator 217 that provides a reference frequency to the clock generator. In an alternative embodiment, the clock generator 215 and oscillator 217 can be replaced by any device that provides the signals described herein. Those skilled in the art will recognize that several alternative devices/circuits are possible. The output of the DAC 206 is coupled to an up-converter, which in one embodiment is a mixer 208. It should be noted that in one embodiment of the disclosed method and apparatus, no filter is required between the DAC 206 and the mixer 208. The mixer 208 has a signal input, a local oscillator (LO) input and a radio frequency output. The LO input receives an LO signal 216, which in one embodiment of the disclosed method and apparatus is the same signal that is coupled to the DAC 206 (i.e., the sample clock signal 214). It will be clear to those skilled in the art that the names of the inputs and outputs are not be taken as a limitation on the nature of the signals that can be provided to the input. Accordingly, the RF output of the mixer is not intended to imply any particular range of frequencies that are output from the mixer 208.

The output of the mixer 208 is coupled to a summer 236. In one embodiment of the disclosed method and apparatus, the output 238 of the summer 236 is coupled to a reconstruction bandpass filter 296.

Channel One includes a second DAC 220 and a second mixer 222. The DSP 205 provides the second DAC 220 with a second digital sample stream 224. The DAC 220 also receives a second sample clock signal 226 generated by the clock generator 215. The output of the DAC 220 is coupled to the mixer 222. As noted above, in one embodiment of the disclosed method and apparatus, no filter is required between the DAC 220 and the mixer 222. The mixer 222 receives an LO signal 230, which in one embodiment of the disclosed method and apparatus is the same as the sample clock signal 226. The output of the mixer 222 is coupled to the summer 236.

As will be described in greater detail below, the structure disclosed in FIG. 2 provides three parameters that can be controlled. Proper selection of two of the three parameters will result in an output 238 at the summer 236 in which a selected sideband (i.e., the lower sideband (LSB) or the upper sideband (USB)) and some of the spectral images are suppressed. In addition, the value of the third of the three parameters can be set to cause the envelope of the output 238 to be skewed in one direction or another, as will be made clear from the description that follows.

The first of the three parameters is the relative phase used by a "phase shifting transform" (PST) that is applied by the DSP 205 to generate the digital sample streams 210 and 224. For example, in one embodiment, the transform $X_i$=PST $\{X, \theta_i\}$ is applied to a digital representation of a baseband signal X: where $X_i$ is the result of the PST applied to the $i^{th}$ channel; and $\theta_i$ is the amount that the phase of the baseband signal is to be transformed. Accordingly, PST $\{X, \theta\} \equiv X\{\theta\}$ is a shorthand way to express the digital sample stream which results from the transform applied to the baseband signal X with a phase transformation of $\theta$.

With reference to Channel Zero, the DSP 205 either receives or generates the digital sample stream of the baseband signal X. $\theta$ is equal to 0° for Channel Zero. The PST applied to the digital sample stream 224 of Channel One results in $X_1$=PST $\{X, -90°\}$. More details about the transform PST $\{X, \theta\}$ are provided below.

The second of the three parameters is the relative phase of the sample clock signals 214, 226. This offset phasing (or offset timing, as explained below) between the sampling clocks provides an additional degree of freedom over prior art in controlling the phase relationships between various spectral images and the desired signal, facilitating in a fundamental way the generation of single sideband (SSB) (thus any complex) signals without the need for filtering between the DACs and mixers. It is thanks to this parameter that the present disclosure has the ability to cancel the unwanted sideband and all converted image terms falling on that sideband, and thus at the output produce only the other, desired single sideband It should be noted that the phase of a periodic signal is directly related to the period of the signal, or more precisely, to the relative point in time at which the period begins with respect to some arbitrary reference point in time. Accordingly, a shift in the phase of a signal having only one spectral frequency component can be expressed as a shift in the time at which each period of the signal begins. In the case of the sample clock signals 214, 226, there is a relative phase shift between the first sample clock signal 214 and the second sample clock signal 226. This shift can be expressed as a shift of −90° of the phase of the second sample clock signal 226 with respect to the first sample clock signal 214. However, the relationship can also be expressed as a delay of the second sample clock signal of $T_{ss}/4$, where $T_s$ is the period of both the first and second sample clock signal. It should be noted that both the first and second sample clock signals have the same frequency and thus the same period, $T_s$. In FIG. 2, the delay of the sample clock signals 214, 226 are represented by the expression $CLK(\tau_i)$, where in $\tau_i$ is the shift in the sample clock signal of the $i^{th}$ channel.

The third of these three parameters is the relative phase of the LO signals 216, 230 coupled to the mixers 208, 222, respectively. As is the case with the sample clock signals 214, 226, the relative phase difference between the LO signals 216, 230 can be expressed as a relative delay in the beginning of the period, $T_{LO}$. It should be noted that the LO signals 216, 230 have the same period, $T_{LO}$, but in the embodiment shown in FIG. 2, the phase of the first LO signal 216 is shifted by −90° or stated in terms of time, is delayed by $T_{LO}/4$. In FIG. 2, the delay of the LO signals 216, 230 are represented by the expression $LO(\psi_i)$, where in $\psi_i$ is the shift in the LO signal of the ith channel. In FIG. 2, the same signal is used for the sample clock signal 214 and the LO signal 216. Accordingly, $\psi_i = \tau_i$. However, it will be seen below that this is not the case in some alternative embodiments.

The sample clock signals 214 provide the DACs 206, 220 with timing information to indicate when the next value provided by the DSP 205 is to be converted from its digital value to an analog output (i.e., converted into an output level, such as a voltage level, current level, resistance level, etc., the level of which is determined by the value of the next digital sample). As noted above, the signals 212, 228 output from the DACs 206, 220 are each a step function that changes amplitude based on the value of the sample and in response to the timing of the sample clock signals 214, 226 respectively.

Operation of the DB-DAC System of FIG. 2

Initially, the DSP 205 either generates or receives a digital sample stream that represents a baseband signal, X. In accordance with one embodiment of the disclose method and apparatus, the baseband signal X is a linear combination of independent baseband signal components. Each such component of X can be selectively transformed by the PST. Depending upon the selection of the phase of the transformation with respect to the delay of the LO, the baseband signal component will be placed on either the LSB or USB. It should be noted that the baseband signal may be initially generated by the DSP 205 directly as a digital sample stream based upon a mathematical description of the baseband signal X.

To facilitate an understanding of the disclosed embodiments, the X signal is described below as having a single component. Once the DSP 205 has the digital sample stream 210, the DSP 205 performs a transform PST $\{X, \theta\}$ on the digital sample stream 210 prior to providing the digital sample stream to the DAC 206. The transform shifts the phase of all positive frequencies in the spectrum of the baseband signal X represented by the digital sample stream 210 an amount equal to θ° and all negative frequencies represented by the digital sample stream 210 an amount equal to −θ°. It will be appreciated by those skilled in the art that such a transform can be accomplished by first performing a Fourier transform on the digital sample stream, then shifting the signals by θ° and then performing an inverse Fourier transform. In this way, each of the spectral components of the signal are shifted either θ° or −θ° depending upon whether the component in the frequency domain has a positive or negative frequency. An alternative way to perform the transform PST $\{X, \theta\}$ is to up-convert the baseband signal with a phase shifted LO (phase shift being equal to the required value θ), then down-convert with the same LO, but without the phase shift (or vice versa). Those skilled in the art will appreciate that there are several other ways in which this transform can be performed.

In the case of the digital sample stream 210 generated for the $0^{th}$ channel (i.e., Channel Zero), $X_0 = PST\{X, \theta_0\}$, where, $\theta_0$ is equal to 0 degrees. Because a zero degree PST is applied to the digital sample stream 210, there is no change to the digital sample stream 210. However, the digital sample stream 224 is generated by the DSP 205 for the $1^{th}$ channel (Channel One) by performing $X_1 = PST\{X, \theta_1\}$, where $\theta_1$ is equal to −90°.

It should be noted that the difference between $\theta_0$ and $\theta_1$ is the first of the three parameters mentioned above for controlling whether the output signal 238 from the DB-DAC will have the LSB or USB. This will be discussed in further detail below.

In addition, the DSP 205 aligns the time at which the samples are taken (i.e., the time at which the baseband signal has the value of the sample) with the sample clock signals 214, 226. Accordingly, the timing of the samples will be coincident with the timing of the sample clock signal. The sample clock signals 214, 226 are generated by the clock generator 215. The sample clock of Channel One is delayed by $T_s/4$, which is expressed in FIG. 2 by the expression $CLK(\tau_i)$ where $\tau_i = T_s/4$. The delay in the time at which each sample is taken is expressed as $X_i(\tau_i)$ which delays the time at which the samples in the $i^{th}$ channel are taken by $\tau = T_s/4$. Accordingly, the DSP 205 delays the time at which each sample is taken by "$\tau_i$". For Channel Zero, $T_0 = 0$ (i.e., for the first digital sample stream 210). Therefore, there is no delay imposed on the time the samples of the digital sample stream 210 are taken in Channel Zero. The delay imposed $X_1(\tau_1)$ on the second digital sample stream 224 is $X_1(\tau_s/4)$, where $\tau_1 = T_s/4$ and $f_s$ is the sample frequency (i.e., the frequency of the sample clock signals 214, 226) and $T_s = 1/f_s$ (i.e., $T_s$ is the period of the sample clock signals 214, 226).

It should be noted that the underlying baseband signal represented by the digital sample stream 224 is not shifted by the delay function $X_1(\tau_1)$, but the delay is merely in the time at which the samples are taken to ensure that the value of the samples represents the amplitude of the underlying baseband signal at the same time the sample clock signal 226 clocks the DAC 220. In one embodiment, the DSP 205 generates a digital sample stream that is time aligned with the second sample clock signal 226. However, in an alternative embodiment, the DSP 205 initially generates just one digital sample stream and then uses that digital sample stream as the basis for PSI transformation of both the first and second digital sample streams 210, 224 that are coupled to the two DACs 206, 220, respectively. In such an embodiment, the DSP 205 can interpolate between the sample times to determine the correct values of the samples at the offset times. It should further be noted that the PST can be performed either before or after the delay function $X_1(\tau_1)$ is performed to generate the second digital sample stream 224.

Conventionally, the sample clocks of a quadrature DAC are aligned in time (I.e., phase) to ensure that the samples represent the same point in time in the I and Q channels. However, the sample clock signals 214, 226 of the disclosed method and apparatus are offset from one another. Accordingly, the DSP 205 that processes the digital sample streams 210, 224 determines the values of the sample stream taking into account the offset of the phase of the sample clocks 214, 226.

Figure 3:
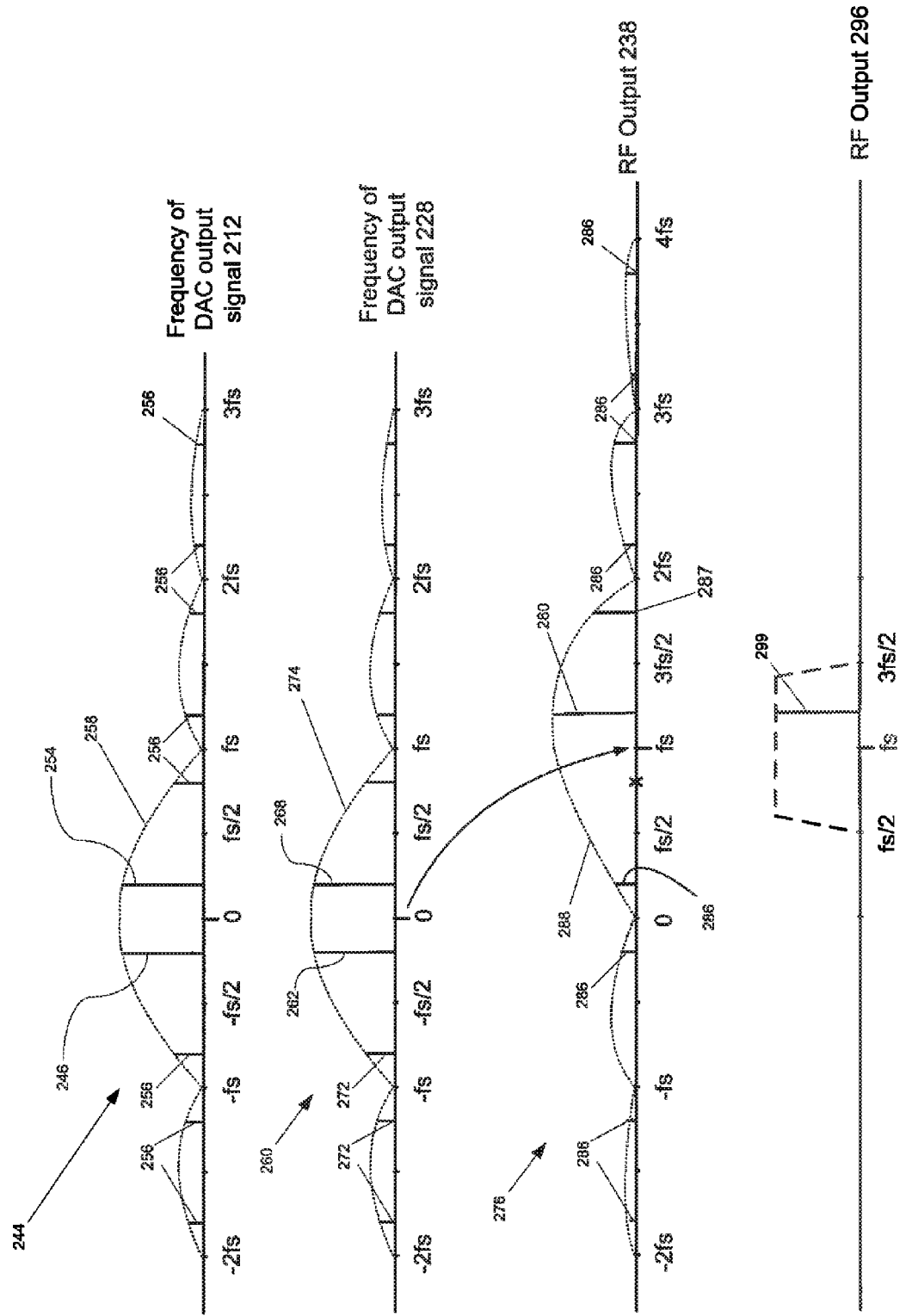
FIG. 3 shows signals frequency domain) generated by the DB-DAC system 200 of the first embodiment.

The difference between $\tau_0$ and $\tau_1$ (I.e., the amount of delay between the sample clock signals 214, 226) is the second parameter mentioned above and, together with the direction of the delay in the LO signal 230, controls which direction the envelope of the output signal 238 will be skewed. As will be discussed in more detail below, if $\tau_1$ is greater than $\tau_0$ (which can be referred to as a clockwise delay), the sample time of the second digital sample stream 224 will be delayed with respect to sample time of the first digital sample stream 210. The delay will cause the envelope of the output signal 238 to be skewed toward the upper frequencies (i.e., the envelope over the positive frequencies will be skewed to the right and the envelope over the negative frequencies will be skewed to the left, as seen in FIG. 3) when the LO signal is also delayed clockwise. Similarly, if both the LO signal and the sample clock signal are delayed in the counter-clockwise direction (i.e., $\tau_1$ delayed with respect to $\tau_0$), then the skew of the envelope will be toward the USB. Alternatively, if the direction of one differs from that of the other, the skew is toward the LSB.

The first mixer 208 receives the signal 212 output from the DAC 206. The desired information is contained in the baseband frequencies from D.C. up to $f_s/2$ (i.e., the first Nyquist zone). The first mixer 208 also receives the first LO signal 216. The first LO signal 216 is generated by the clock generator 215. In accordance with one embodiment of the disclosed method and apparatus, the LO signal 216 is the same as the sample clock signal 214. The LO signal 216 is in phase with the sample clock signal 214. Accordingly, the phase of the LO signal 216 is 0 degrees with respect to the sample clock signal 214.

The mixer 208 generates an RF output signal 218 by upconverting (i.e., multiplying) the output signal 212 of the DAC 206 with the LO signal 216. It will be understood by those skilled in the art that the mixer 208 can be implemented as any device, circuit or signal processing block that is capable of multiplying the two inputs to the mixer 208. One skilled in the art will recognize that analog or digital circuitry may be used, such as quad switches, analog multiplexors (mux), commutators, and Gilbert cells for example. Switches may be used because the mixer inputs 212, 228 are in a stair-case waveform. Switches can be driven hard for low conversion loss and high output level, and still achieve low distortion.

The second mixer 222 receives the output signal 228 of the second DAC 220 and modulates it with a second LO signal 230. The second LO signal 230 is delayed by $T_s/4$, which is the equivalent of $-90°$ at the frequency $f_s$. The delay of the LO is expressed in FIG. 2 as LO ($T_s/4$). In addition, the notation in the figures indicates LO ($T_s/4$) @ $f_s$ to further notate that the frequency of the LO is $f_s$. Accordingly, the second mixer 222 generates a second RF output signal 232. This convention is used throughout the figures.

In some embodiments of the presently disclosed method and apparatus, the input signals to the DAC system 200 originate in the DSP 205. Therefore, the DSP 205 can directly calculate the proper values for the samples of the digital sample streams 210, 224 taking into account the phase offset of the sample clock signals 214, 226. However, in some embodiments, the DSP 205 will receive a first and second digital stream of samples from an external source, the samples of the first digital stream representing the same sample times as the samples of the second digital stream. Accordingly, the DSP 205 will need to interpolate what the value of the samples of one of the streams should be at a time that is shifted relative to the other stream to account for the $T_s/4$ delay between the sample clock signals 214, 226. Some interpolating methods include using a finite impulse response (FIR) filter to perform interpolation, polynomial interpolation, and sample and hold interpolation, for example. However, any means may be used for providing a digital stream that represents signals in which the frequency spectrum of the first signal is a predetermined phase offset from the frequency spectrum of the second signal and the sample times of the first signal are shifted by the predetermined time offset with respect to the second signal and that time offset is provided in the phase offset of the sample clocks. Failing to take into account the phase difference between the sample clock signals 214, 226 will cause an undesirable shift in the second signal $X_1$ represented by the digital sample stream 224.

The embodiment of the DB-DAC system 200 in FIG. 2 further includes a summer 236. The signal 218 is coupled to a first input of the summer 236. The signal 232 is coupled to a second input of the summer 236. Accordingly, the output of the summer 236 is the sum of the signals 218, 232. It should be understood by those skilled in the art that the summer 236 can be implemented as any circuit, component or processing device that results in the sum of the two signals 218, 232. The summer 236 generates a DB-DAC RF output signal 238.

FIG. 3 shows signals (in the frequency domain) generated by the DB-DAC system 200 of the first embodiment. Accordingly, joint reference will now be made to FIG. 2, and FIG. 3.

FIG. 3 shows a frequency spectrum 244 of the first DAC output signal 212. The frequency spectrum 244 includes the desired USB signal 254. The frequency spectrum 244 also includes an unwanted mirror image 246 of the desired signal 254 in the LSB 254. The frequency spectrum 244 further includes spectral images 256 and the sine envelope 258.

FIG. 3 also shows a frequency spectrum 260 of the second DAC 220 output signal 228. The frequency spectrum 260 includes a desired image 268 in the USB. The frequency spectrum 260 also includes an unwanted mirror image 262 of the desired signal 268 in the LSB. The frequency spectrum 260 further includes spectral images 272 and the sine envelope 274.

With reference to FIG. 2, the first mixer modulates the first DAC output signal 212 with a first LO signal 216. The first LO signal 216 has a frequency equal to the sampling frequency $f_s$. The second mixer 222 modulates the second DAC output signal 228 with a second LO signal 230. The second LO signal 230 also has a frequency equal to the sampling frequency $f_s$. In the embodiment shown in FIG. 2, the phase of the second LO signal 230 is $-90°$ from the phase of the first LO signal 216. Stated in terms of time, the second LO signal 230 lags the first LO signal 216 by one-quarter of a sample clock period (e.g., $T_s/4$).

FIG. 3 also shows a frequency spectrum 276 of the DB-DAC RF output signal 238 (shown in FIG. 2) after up-conversion by the two mixers 208, 222 and summing by the summer 236. The frequency spectrum 276 is centered about the LO frequency $f_{LO}$ of the first LO signal 216. It should be noted that the second LO signal 230 is at the same frequency $f_{LO}$. The LO frequency $f_{LO}$ in the embodiment shown in FIG. 2 and FIG. 3 is equal to the sampling frequency $f_s$. The spectrum shift from a center frequency of 0 Hertz (Hz) to a center frequency of $f_s$ is a result of the frequency up-conversion performed in the first mixer 208, and the second mixer 222. When the two up-converted signals 218, 232 are summed in the summer 236, the desired signal 280 appears in the USB of the frequency spectrum 276. However, the undesired LSB of the signals 218, 232 (See FIG. 2) cancel due to the phase rotations in the DSP 205 (i.e., from the PST), due to the quadrature-timing of the DAC clocks and due to the quadrature relationship of the LO signals 216, 230. The nearest spectral artifact 287 in the spectrum of the DB-DAC RF output signal is outside the bandwidth of interest ($f_s/2$ to $3f_s/2$) of the desired signal 299, as shown in the spectrum in FIG. 3.

An additional benefit of the presently disclosed method and apparatus is that the sine envelope 288 in the frequency response of the DB-DAC RF output signal 276 is skewed to the USB due to the manner in which the mixing products of the two signals 212, 226 sum together. That is, the frequency response of the DB-DAC RF output signal 276 is asymmetrical, causing the sine envelope 288 to skew in the direction of the USB. The asymmetry of the sine envelope 288 in the first embodiment advantageously results in a flatter frequency response in the frequencies near the desired USB.

In one alternative embodiment of the disclosed method and apparatus, the three parameters are selected so that the LSB remains, the USB is suppressed and the skew of the envelope is toward the LSB. In one such embodiment, the PST performed by the DSP 205 to generate the second digital sample stream 224 is $X_1=PST\{X, 90°\}$ and the delay $\tau_1$ of the sample clock signal 226 is $\tau_1=-T_s/4$ (i.e., a phase shift of the sample clock signal 226 is 90° or the $\tau_1=0$ and $\tau_0=T/4$ so that $\tau_0$ is delayed with respect to $\tau_1$). By making the PST shift 90° (rather than −90° as is the case in the embodiment shown in FIG. 2) and making the shift of the sample clock signal 226 $-T_s/4$ (rather than $T_s/4$ as was done in the embodiment shown in FIG. 2) but leaving the shift of the LO signal 232 at −90°, the USB will remain and the envelope will be shifted to toward the USB. However, the DSP 205 must adjust the sample times of the digital sample stream 224 such that the samples represent the amplitude of the underlying baseband signal at the time at which the sample clock signal 226 will cause the samples to be converted to an amplitude level by the DAC 220. Accordingly, the same value $\tau_1$ must be used to delay the sample clock signal 226 (i.e., 90° or $-T_s/4$) as is used to delay the samples of the digital sample stream 224 output from the DSP 205.

In another alternative embodiment, the skew can be left as shown in FIG. 3 by leaving the shift of the sample clock signal 226 at −90° ($T_s/4$). In yet another embodiment, the USB can be selected rather than the LSB by giving the phase of the LO signal 230 applied to the second mixer 222 an offset of 90° with respect to the phase of the LO signal 216 and keeping the function $X_1=PST\{X, -90\}$. Accordingly, if both the angle of the PST applied to generate the digital sample stream 224 and angle that the LO signal 232 are rotated are in the same direction, then the LSB will survive and the USB will be suppressed. However, if the angle of the PST is opposite the angle of rotation of the LO signal 232 (one to 90° and the other to −90°), then the USB will survive and the LSB will be suppressed.

In the embodiment of the disclosed method and apparatus shown in FIG. 2, a bandpass filter 296 is coupled to the DB-DAC RF output. FIG. 3 shows the frequency spectrum 299 of the RF bandpass output signal 298. The frequency spectrum 299 has no undesired energy (i.e., has a "clean" frequency spectrum). That is, the undesired out-of-band spectral images 286 in the RF DB-DAC output signal 238 are no longer present in the frequency spectrum 299.

Providing a clean frequency spectrum 299 is achieved with a lower complexity and wider bandwidth filter in the RF bandpass output. The filter's wider BW allows faster frequency changes in channel switching or tuning. Furthermore, the channel switching is achieved without the need for a second independent clock source. This eliminates the need for tuning mechanisms with independent clock sources to achieve channel switching. Significant cost savings and chip size reduction are thus achieved by embodiments with clean frequency spectrums, which achieve channel switching without a second clock source, and without filters in-between DACs and mixers.

It can be seen that unlike the prior art, no reconstruction filters are needed at the output of the DACs 206, 220. However, in one embodiment of the disclosed method and apparatus, filters are used to filter some of the remaining higher frequency terms. The cutoff frequency of the filter is above the signal bandwidth, but not restricted to the Nyquist frequency, i,e. the cut-off can be much above the conventional Nyquist filters. For example, higher frequency image terms may not be as well matched between DACs 206, 220 in the different channels. Therefore, removing such image terms by placing identical filters with cut-off at these higher frequencies in each channel at the output of the DACs 206, 220.

In some cases the sine envelope profile, including the skew, may be undesirable, for instance when a flat profile of the output spectrum is required. To flatten the output response, a digital correction, or pre-emphasis, can be applied to the baseband signals. Such correction may consist of a 1/sine correction term, combined with another term equalizing the skew of the envelope. While the 1/sine correction typically exhibits a frequency symmetry around the DC (i.e. around the carrier after conversion), the skew correction will exhibit an asymmetry around the DC (i.e. around the carrier after conversion). It can be shown that the amount of skew can be determined analytically and the second correction term derived accordingly. Alternatively, the correction terms may be determined by simulation or other means.

Harmonic Bandpass DAC System

Figure 4:
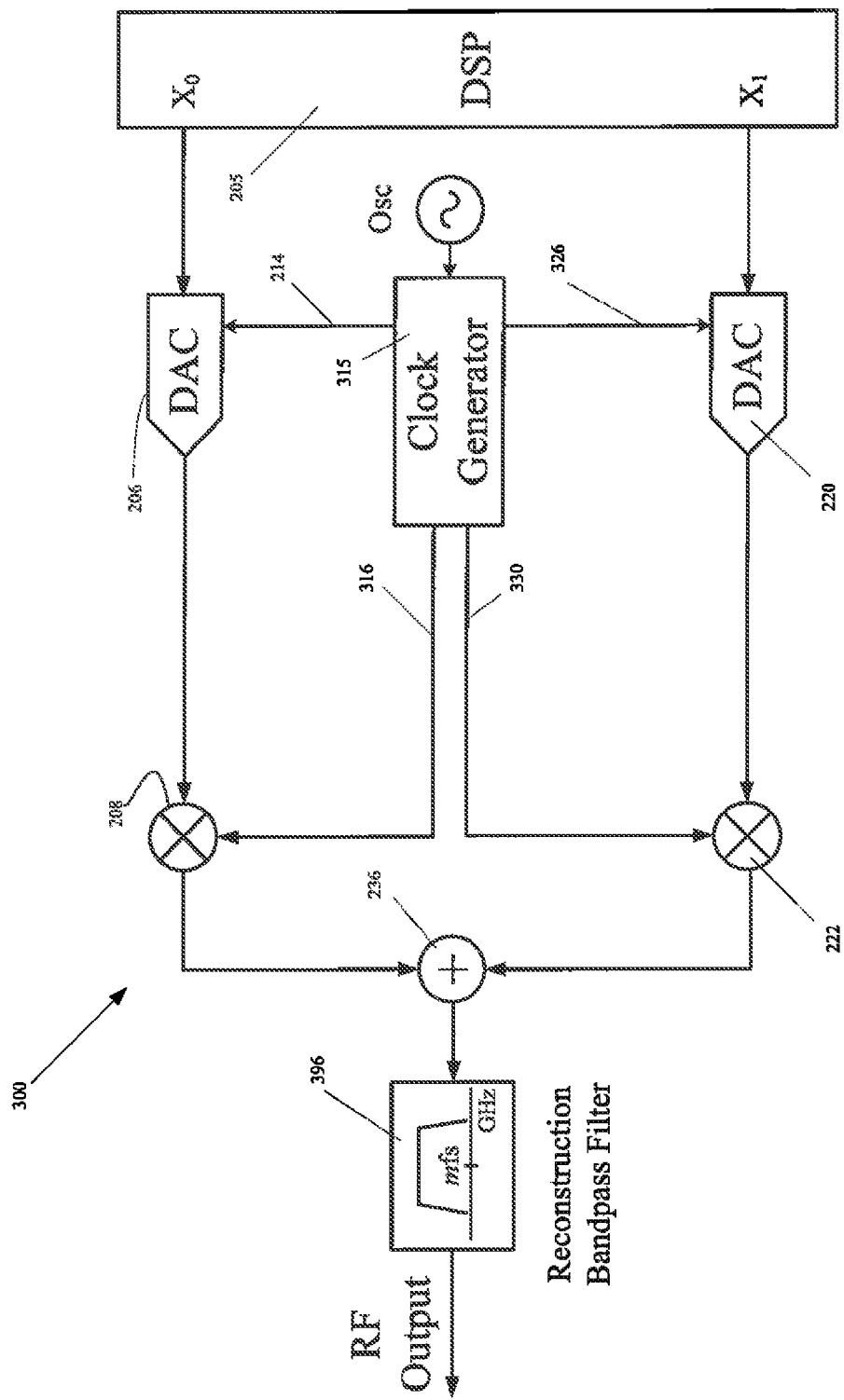
FIG. 4 illustrates a Harmonic Dual Bandpass DAC (HDB-DAC) system 300.

FIG. 4 illustrates a Harmonic Dual Bandpass DAC (HOB-DAC) system 300. The architecture of the HDB-DAC 300 is similar to the architecture of the DB-DAC of FIG. 2. The DSP 205, DACs 206, 220, mixers 208, 222 and summer 236 of the HDB-DAC 300 are all the same as those discussed above with regard to the DB-DAC of FIG. 2. However, the clock generator 315 of the HDB-DAC 300 shown in FIG. 4 produces a first and second sample clock signal 214, 326 and a first and second LO signal 316, 330. The first and second sample clock have a frequency of $f_s$. The first and second LO signals 316, 330 have a frequency of $f_{LO}=mf_s$. The second sample clock signal 326 lags the first sample clock signal 214 by $(T_s/4)*(1/m)$. The second LO signal 330 lags the first LO signal 316 by $(T_s/4)*(1/m)$. Since the sample clock signal 326 is delayed, the sample times for the digital sample stream 324 output from the DSP 305 must be adjusted so that the value of the samples reflects the amplitude of the baseband signal at the sample time indicated by the delayed sample clock signal 326. A reconstruction bandpass filter 396 can be used to eliminate any undesirable out of band images. It will be understood by those skilled in the art that the PST for harmonic mixing will not have the phase shifts scaled by a factor of m, but rather the PSTs will be the same as in the case of non-harmonic mixing, i.e. as with the frequency conversion with fundamental clock frequency $f_s$, as previously described per FIG. 2, That is, for harmonic mixing the shift for the $X_1$ transform that is imposed on the spectral components of the baseband signal by the PST is the same −90° for all positive frequencies and 90° for all negative frequencies as the $X_1$=PST{X,−90°} used in the fundamental mixing per FIG. 2, where X is the baseband signal.

Generalized N-Array RF DAC

Figure 5:
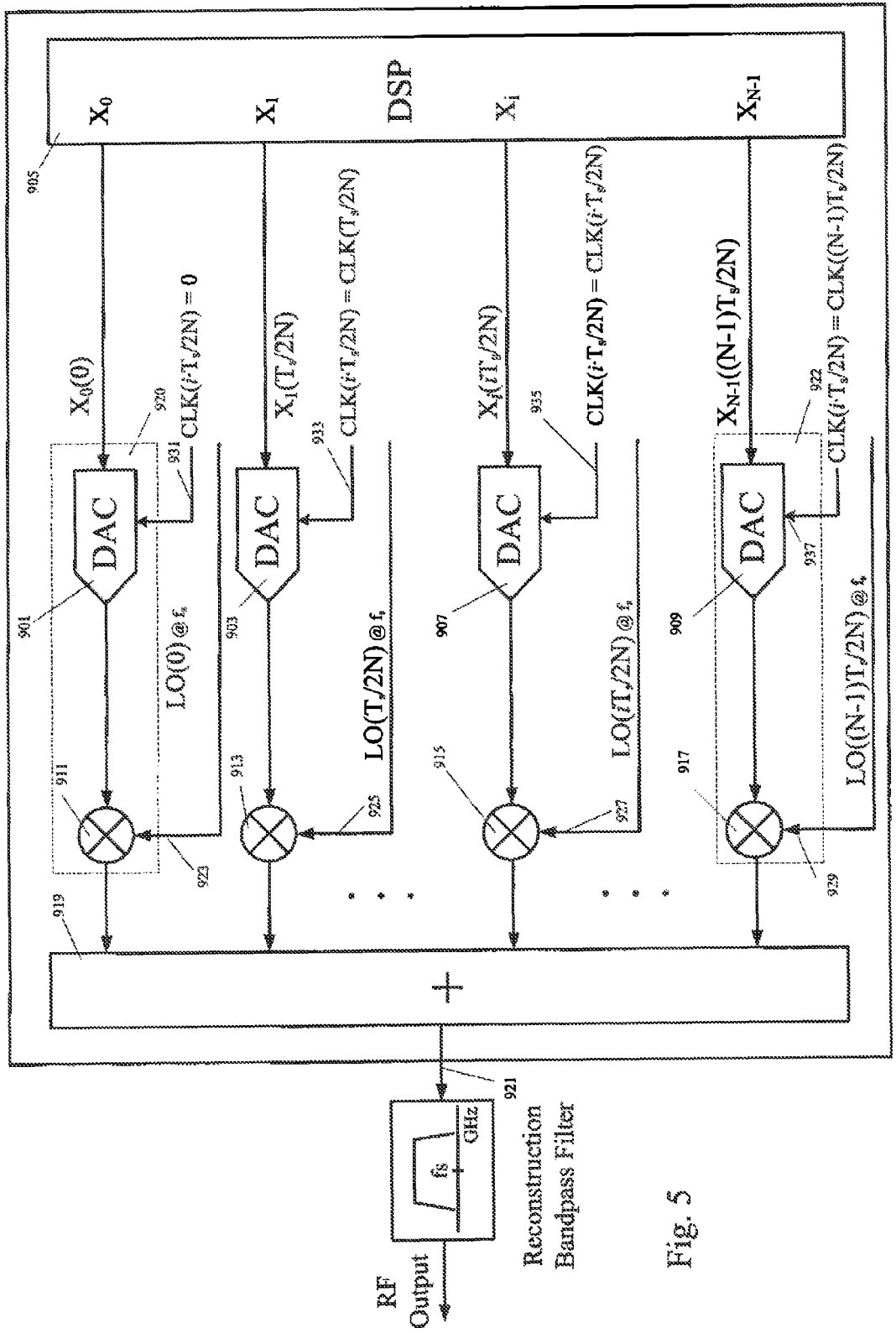
FIG. 5 illustrates an N-array RF DAC 900.

FIG. 5 illustrates an N-array RF DAC 900. N is the number of channels (or DAC paths) that are present in any particular embodiment of the RF DAC system of the disclosed method and apparatus. The N-array RF DAC provides a structure that allows the concepts and methods that were introduced in FIG. 2 and FIG. 2a above to be used for the more general case of an arbitrary integer N≥2. This includes a case of a larger values of N, for example N=3, 4, 5, 6, 8, 10, 12, 14, 15, 16, 18, 20. The benefits of using a greater number of DACs may include cleaner output spectrum (i.e. a greater number of unwanted image converted terms canceled), requiring less or lower complexity/cost filtering, as well as increased power of the output RF signal. The output power is increased because the desired signal outputs of all DACs are summed substantially in-phase, constructively increasing the desired signal power by a factor of N. The increased RF power may allow elimination of any output power amplifiers that otherwise may need to be used.

Three parameters can be manipulated to control whether a USB or LSB is output, and whether the envelope at the output is skewed toward the USB or the LSB. Those three parameters consist of: (1) the angle of a PST performed by a DSP on a baseband signal; (2) the time delay imposed on the sample clocks used to clock the DACs; and (3) the phase of the LO signals used to up-convert the DAC output signals. The generalization shown in FIG. 5 expands the previously disclosed concept to multiple channels, the benefit of which is discussed in more detail below.

The N-array RF DAC 900 consists of a DSP 905, a plurality, N, of DACs 901, 903, 907, 909 (four of which are shown expressly in FIG. 5), N mixers 911, 913, 915, 917 (four of which are shown expressly in FIG. 5) and a summer 919. Each DAC/mixer pair constitutes a channel. The channels are numbered from Channel Zero 920 at the top of FIG. 5 to Channel N−1 922 at the bottom of FIG. 5. As was the case in the embodiment shown in FIG. 2, the DSP 905 performs a PST {X, θ} on the baseband signal to generate each of the N signals that will be output from the DSP 905 to the N DACs 901, 903, 907, 909. In the general case shown in FIG. 4, the value θ of the phase shift for the $i^{th}$ channel is calculated as $\theta_i = -i \cdot k \cdot 180°/N$, where k is any integer, excluding the values equal to N and integer multiples of N. The case of θ=180°/N (and its odd multiples) is referred to as "half-circle", signifying that the phases of all states are distributed around the half-circle, and θ=2·180°/N=360°/N (and its multiples) is referred to as "full-circle", signifying that the phases are distributed around the whole circle.

The particular value of θ for the embodiment shown in FIG. 5 is chosen for k=1 at θ=180°/N, so for the $i^{th}$ channel the phase shift is calculated as $\theta_i = -i \cdot 180°/N$, with the negative sign chosen. This will cause the sense of the signal phase shifts to progress in increments clockwise through the channels from Channel Zero through Channel N−1, with increasing delay. The result will yield the LSB signal at RF output 921, assuming the LO signals coupled to each mixer 911, 913, 915, 917 follow the same sense. Reversing the sense (i.e., $\theta_i = +i \cdot 180/N$) of the phase shift into the opposite direction (increments counter-clock wise, i.e. decreasing delay or advancing the phase) will yield the USB sideband at the RF output 921, assuming the clockwise direction of rotation of the LO signals remains unchanged.

Sample clock signals 931, 933, 935, 937 are generated by a clock generator 939 (not shown for simplicity). Each sample clock signal 931, 933, 935, 937 is coupled to a respective one of the DACs 901, 903, 907, 909. The sample clock signals 931, 933, 935, 937 clock the DACs, 903, 907, 909 to generate an amplitude level output for each sample that is input to the DACs from the DSP 905. In one embodiment, the sample clock signals 931, 933, 935, 937 are staggered such that each signal lags the sample clock signal associated with the prior channel. The lag of the sample clock signal for the $i^{th}$ channel is $i \cdot T_s/2N$, where "i" increments from zero to N−1 for each channel and $T_s$ is the period of the sampling frequency, $f_s$. Accordingly, the delay in the $3^{rd}$ channel of an array with 4 channels would be $3 \cdot T_s/8$ with "i"=3 and N=4. It can be seen that if there are two channels, as was the case in FIG. 2, the delay applied to the second sample clock signal 230 (i.e., Channel One) would be $1 \cdot T_s/4$, with "i"=1 and N=2. As can be seen, the first sample clock signal 214 (Channel Zero) has a delay of zero (as is the case no matter what the value of N). With each sample clock signal lagging the signal associated with the previous channel, and assuming that the LO clocks of each channel are similarly lagging the LO clock of the previous channel, the envelope of the output 921 will be skewed to the upper sideband. Reversing the direction of the sample clock signal (i.e., having each sample clock signal lead the signal of the previous channel) while keeping the direction of the delay in the LO signal unchanged, will cause the envelope to be skewed to the lower sideband. As noted above with respect to the embodiment shown in FIG. 2, the timing of the samples output by the DSP 905 must be adjusted so that the sample times are coincident with the timing of the associated sample clock signal. Therefore, the DSP 905 must ensure that the values of each sample in the various digital sample streams coupled to the various DACs represent the amplitude of the baseband signal at the time the sample clock signal indicates that particular sample is to be converted by the DAC.

An LO signal 923, 925, 927, 929 is coupled to the LO port of each mixer 911, 913, 915, 917, respectively. In one embodiment of the N-array RF DAC shown in FIG. 5, the same signal serves as both the sample clock signal and the LO signal.

In general, any combination of the relative sense of the delays (or advance) between LO signals, sample clock signals and shifts imposed by the PST can be chosen. As show above and in the examples provided below, different combinations will result in different sidebands (LSB or USB) and different skews of the sine envelope at RF output. In accordance with one embodiment of the disclosed method and apparatus, these parameters are programmable, facilitating optimization of the implementation and performance of the N-array RF DAC system.

Harmonic N-Array RF DAC System

Figure 6:
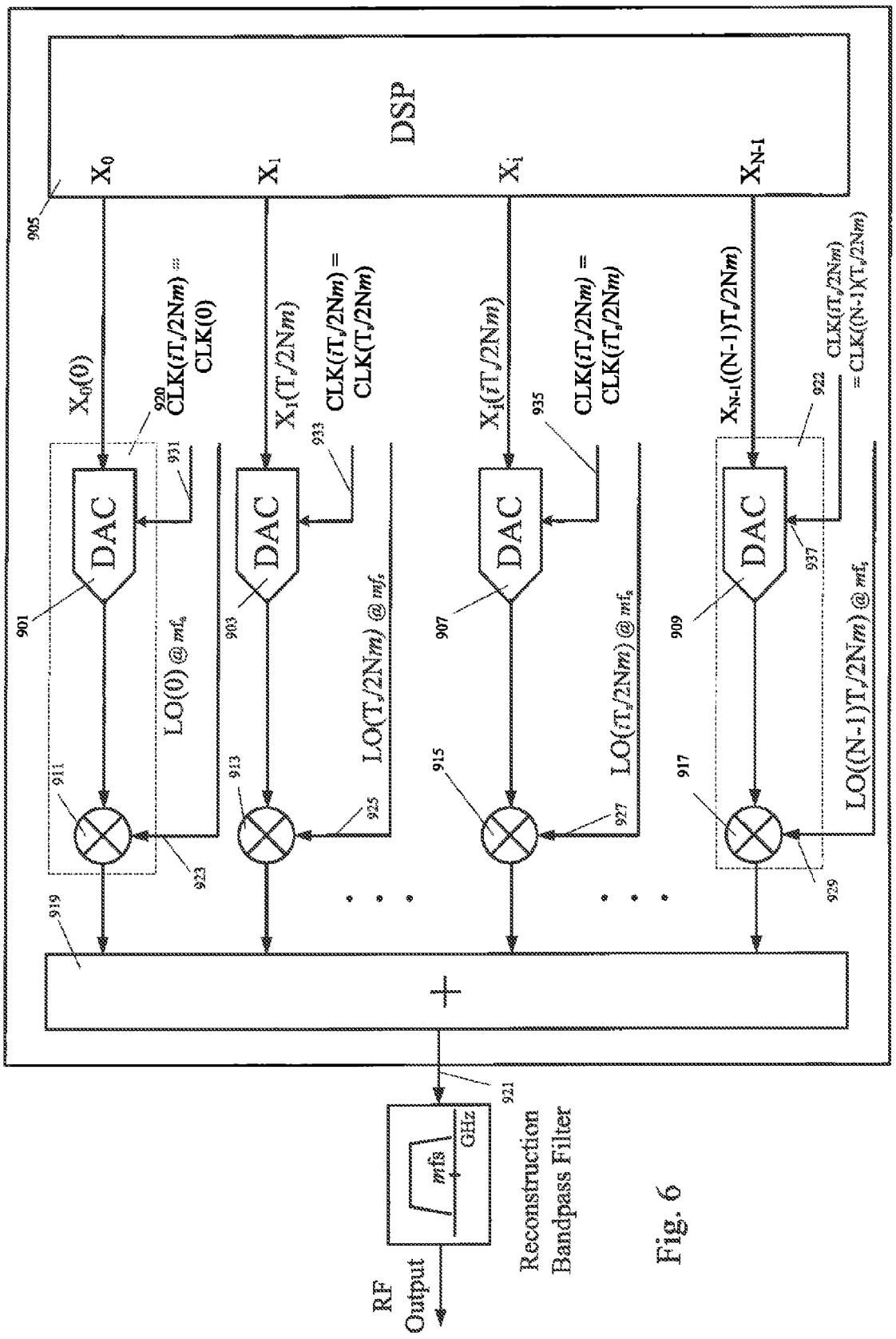
FIG. 6 illustrates that the N-array RF DAC of FIG. 5 can be implemented with LO signals having a frequency that is the mth harmonic of the sampling frequency $f_s$.

FIG. 6 illustrates that the N-array RF DAC of FIG. 5 can be implemented with LO signals 923, 925, 927, 929 having a frequency that is the $m^{th}$ harmonic of the sampling frequency $f_s$. In general, the clock delay increment is $\tau_s/m$, where $\tau_s = T_s/2N$ or an integer multiple of this term (i.e. $1 \cdot T_s/2N$, $2 \cdot T_s/2N = T_s/N$, ..., $k \cdot T_s/2N$, where integer k≠N and multiples of N). In one embodiment of harmonic mixing, the relative delay of each LO signal is $i \cdot T_s/2mN$, where i increments from zero to N−1 for each channel, N is the number of channels in the array, and m is the harmonic of the LO signal (i.e., $f_{LO} = mf_s$). The delay to be applied to each of the $i^{th}$ sample clock signals is $i \cdot T_s/2$ mN. As noted above, any time the timing of the sample clock signals is delayed, the sample times calculated by the DSP 905 must be adjusted to coincide with the sample clock. The adjustment ensures that the samples output from the DSP 905 represent the amplitude value of the underlying baseband signal X at the time the sample clock signals 931, 933, 935, 937 clock the sample into the DACs 901, 903, 907, 909.

The PST transforms are not affected in the harmonic case. Unlike the clocks time delays, the phase shifts of the transformed baseband signals are not scaled by a factor m, so that all phase shifts remain the same as with the case of fundamental mixing.

In one embodiment, the harmonic factor "m" is an integer number. However, in an alternative embodiment, in can be a rational number (ratio of two integers, e.g. m=5/2). However, not all rational numbers yield satisfactory results, so each case should be checked separately.

Full Circle N-Array RF DAC System

It can be seen that the rotations in phase applied to each of the PSTs performed on the signals in FIG. 5 are all constrained to angles between zero and −180°, or in the ease in which the rotation is the opposite (clock-wise) direction, between zero and 180°. Therefore, this implementation can be referred to as a "half-circle" implementation of the N-array RF DAC. In an alternative embodiment shown in FIG. 7, the angles are constrained to a range of zero to −360°, or in the case of rotation in the clockwise direction, zero to 360°. It should be noted that the architecture is identical. Only the amount of rotation or delay applied to the PST, the sample clock signals, the time of the samples output by the DSP 1005, and the LO signals changes from that shown in FIG. 5.

Figure 7:
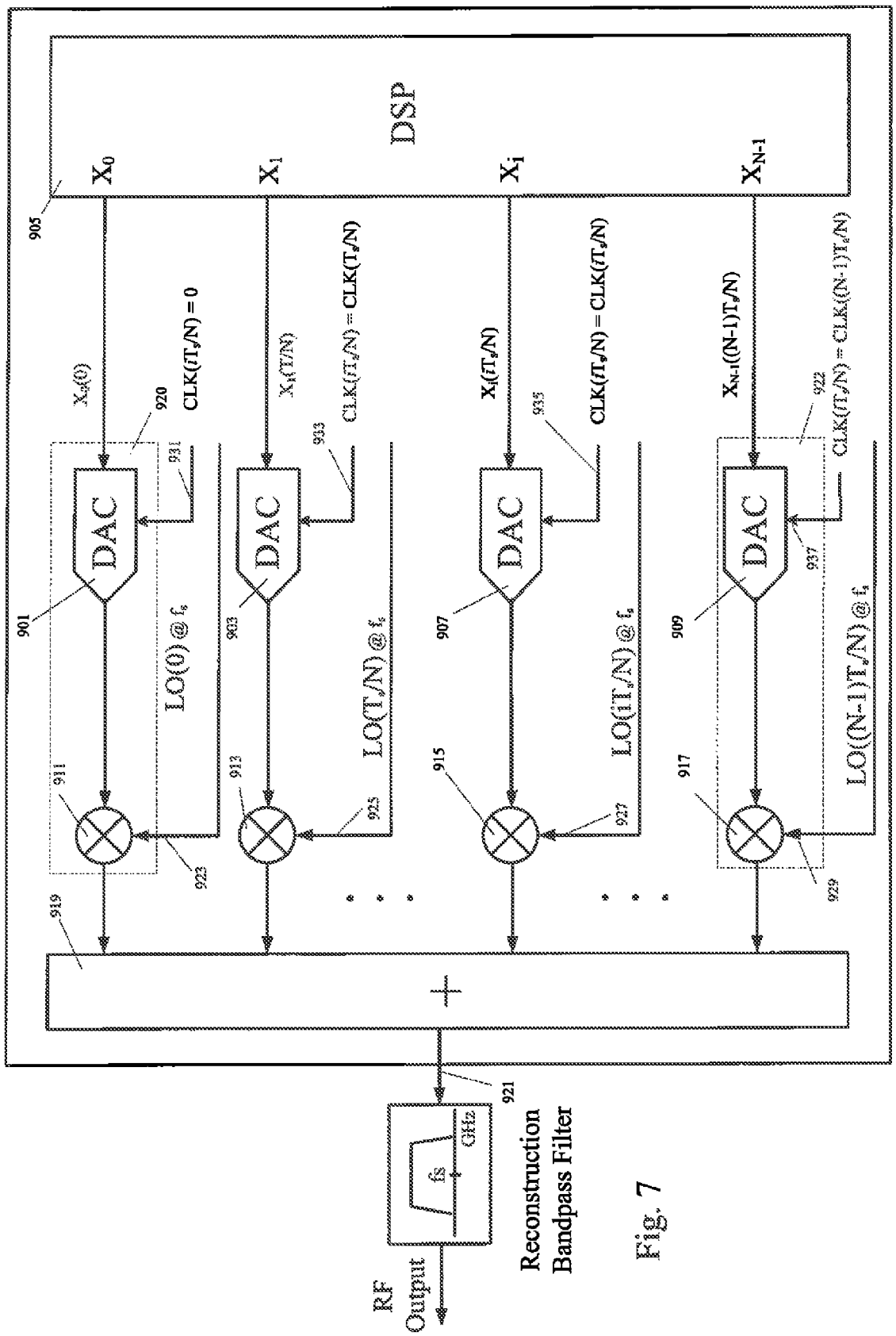
FIG. 7 illustrates a full-circle N-array RF DAC.

FIG. 7 illustrates a full-circle N-array RF DAC. As shown, the PST {X, θ°} is performed on the underlying baseband signal X using the angles θ°=−i360/N, where N is the number of channels in the array and i is the channel number from zero to N−1. The amount of delay that is applied to each sample clock signal 931, 933, 935, 937 is $\tau_i = iT_s/N$. This same delay is then applied to the time at which each sample is taken to ensure that the value of each sample reflects the amplitude of the underlying baseband signal at the time the sample is clocked into the DAC 901, 903, 907, 909. In one embodiment, the delay that is applied to each of the LO signals 911, 913, 915, 917 is equal to that applied to the sample clock signals 931, 933, 935, 937, respectively as the same signal is used for both the sample clock signal and the LO signal in each channel. With these values applied, the output signal 921 will contain the LSB and the envelope will be skewed toward the USB. However, in an alternative embodiment, the rotation of the angles/delays down through the array of channels can be reversed in either the PST (i.e., θ°=i360°/N) or in the LO signals 911, 913, 915, 917 ($\psi_i = -iT_s/2N$), but not both, in order to cause the output signal 921 to contain the USB. If the direction of both the LO signals and the PST are reversed, then the output signal will contain the LSB, as the two reversals will cancel one another. Independent of the direction of rotation of the PST phase, the envelope can be skewed to the LSB rather than the USE by reversing the direction of the rotation of the delay applied to the sample clock signal (i.e., $\tau_i = -iT_s/2N$) and keeping the delay of the LO unchanged.

Harmonic Full Circle N-Array RF DAC System

Figure 8:
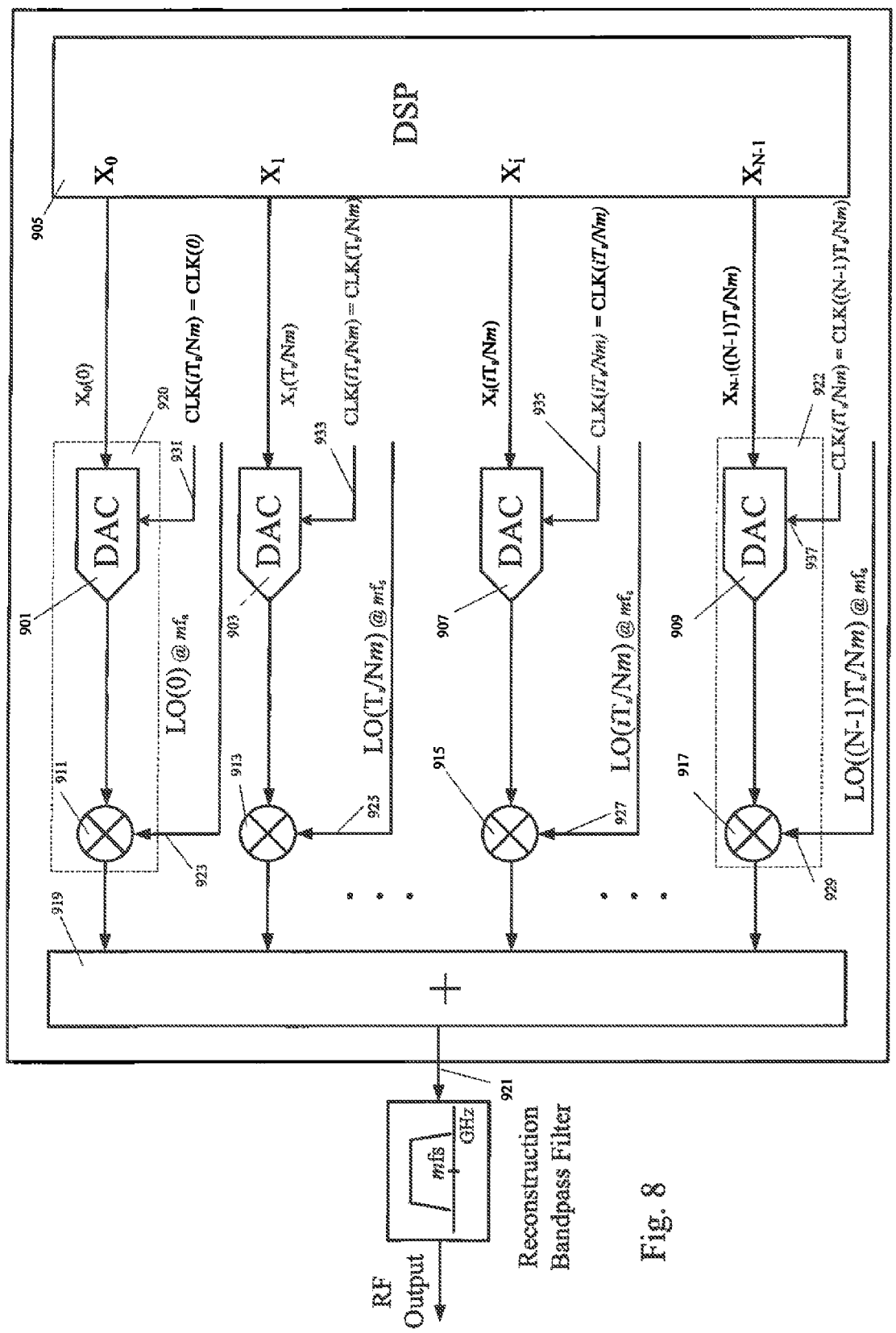
FIG. 8 illustrates that the full circle N-array RF DAC of FIG. 7 can be implemented with LO signals having a frequency that is the mth harmonic of the sampling frequency $f_s$.

FIG. 8 illustrates that the full circle N-array RF DAC of FIG. 7 can be implemented with LO signals 923, 925, 927, 929 having a frequency that is the mth harmonic of the sampling frequency $f_s$. In one such embodiment, the relative delay of each LO signal is $i(T_s/mN)$, where i increments from zero to N−1 for each channel, N is the number of channels in the array, and in is the harmonic of the LO signal (i.e., $f_{LO} = mf_s$). The delay to be applied to each of the ith sample clock signals is $i(T_s/mN)$. As noted above, any time the timing of the sample clock signals is delayed, the sample times calculated by the DSP 905 must be adjusted. The adjustment ensures that the samples output from the DSP 905 represent the amplitude value of the underlying baseband signal X at the time the sample clock signals 931, 933, 935, 937 clock the sample into the DACs 901, 903, 907, 909.

As noted in the discussion of FIG. 6, the harmonic factor "m" is an integer number. However, in an alternative embodiment, m can be a rational number (ratio of two integers, e.g. m=5/2). However, as also noted above, not all rational numbers yield satisfactory results, so each case should be checked separately.

Full Circle Four-Array RF DAC System

Figure 9:
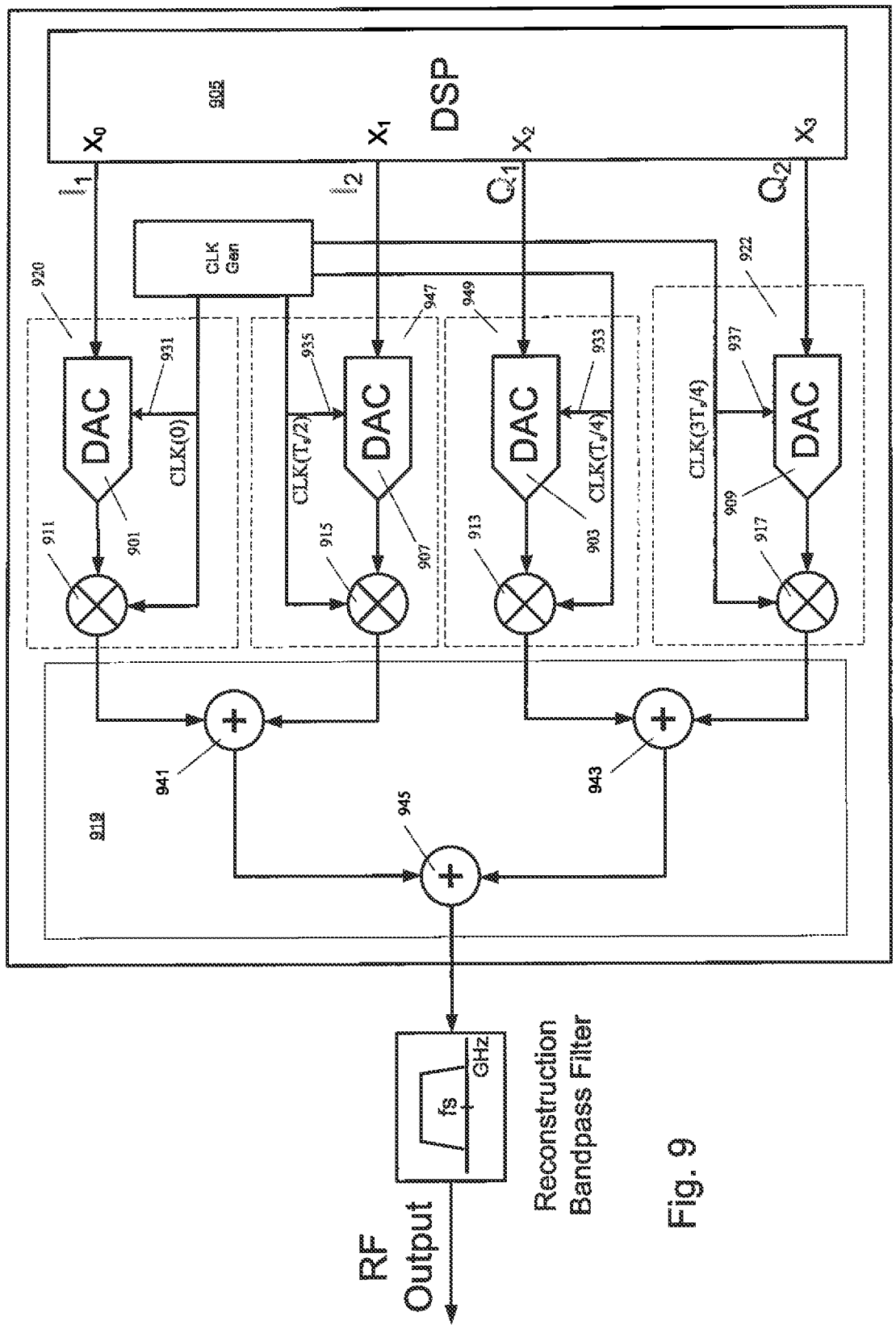
FIG. 9 shows a special case of the embodiment previously shown in FIG. 7.

FIG. 9 shows a special case of the embodiment previously shown in FIG. 7. That is, FIG. 9 shows the embodiment previously shown in FIG. 7, but the for the particular case in which N=4. In addition, FIG. 9 shows Channel Zero and Channel Two being summed together in a summer 941 within the summer 919, and Channel One and Channel Three being summed together in a summer 943 within the summer 919. The outputs of the summers 941, 943 are summed in a third summer 945.

As was disclosed in the discussion above referring to FIG. 5, the DSP 905 applies a PST {X, θ°} to an underlying baseband signal X to generate four digital sample streams. As noted in the discussion of FIG. 5, θ°=−i360°/N, where i is the channel number from zero to N−1, and N is the total number of channels 920, 922, 947, 949. Accordingly, for the digital sample stream associated with Channel Zero 920, θ°=0°. The digital sample stream associated with Channel Two 947 is transformed by the PST with θ°=−(2)(360°/4)=−180°. Note that Channel Zero 920 and Channel Two 947 are paired, and so are adjacent to one another in FIG. 9. The digital sample stream associated with Channel One 949 is transformed by the PST with θ°=−(1)360°/4=−90°. The last digital sample stream associated with Channel Three 922 is transformed by the PST with θ°=−(3)360°/4=−270°.

The first such digital sample stream $X_0$ is provided to the DAC 901. The sample times of the samples of each of the other three such digital sample streams are delayed, as has been discussed above, to align the sample times to sample clock signals 931, 933, 935, 937 coupled to the DACs 901, 903, 907, 909. That is, the sample clock signals 931, 933, 935, 937 are each delayed by $\tau = i(T_s/N)$. Therefore, the sample clock signal 931 coupled to the DAC 901 for Channel Zero 920 is not delayed (i.e., $\tau_0 = 0(T_s/N) = 0$). The sample clock signal 935 for Channel Two 947 is delayed by $\tau_2 = 2(T_s/4) = T_s/2$ or one half the sample period $T_s$ (the equivalent of −180° at the sample frequency $f_s$). Accordingly, the sample time of each sample in the digital sample stream output from the DSP 905 to the DAC 905 is delayed by $T_s/2$. As mentioned above, the underlying baseband signal is not delayed, but only the time the sample is taken to ensure that the value of each sample in the sample stream represents the amplitude of the baseband signal at the time the sample is clocked into the DAC 901 by the sample clock signal 933. The sample clock signal 933 for Channel One 949 is delayed by $\tau_2 = 1(T_s/4)$ or the equivalent of −90° at the sample frequency $f_s$. Lastly, the sample clock signal 937 for Channel Three 922 is delayed by $\tau_3 = 3(T_s/4)$ or the equivalent of −270° at the sample frequency $f_s$.

The output of each DAC 901, 903, 907, 909 is coupled to the mixers 911, 913, 915, 917. The LO signals 923, 925, 927, 929 are provided to the mixers to up-convert the DAC outputs. Each LO signal 923, 925, 927, 929 is delayed by $\psi = iT_s/N$. Accordingly, the LO signal 923 of Channel Zero is not delayed, the LO signal 927 of Channel Two is delayed by $T_s/2$ (the equivalent of −180° at $f_s$), the LO signal 925 of Channel One is delayed by $T_s/4$ (the equivalent of −90° at $f_s$), and the LO signal 929 of Channel Three is delayed by $3T_s/4$ (the equivalent of 270° at $f_s$).

Looking now at the relative phases of the signals that pass through Channel Zero and Channel One, those skilled in the art will understand that the transformation provided by the PST will cause a first phase shift of 180° in the phase of the underlying baseband signal X. Therefore, the when the digital sample stream is input to the DACs, the two signals are out of phase. The relative phase of the sample clock and the delay in the time at which the samples are taken has no affect on the phase of the underlying baseband signal. However, the images that are generated in the DACs due to the mixing of the first harmonic of the sample clock with the baseband signal will be shifted by an additional 180° (i.e., the amount of the delay in the sample clock plus the amount of the baseband signal due to the PST). It should be noted that the phase changes for the images at even harmonics of $f_s$ created in the DAC 901, 903, 907, 909. Accordingly, the images create at the first harmonic by the DACs 901, 907 will be in phase and the underlying baseband signal will be out of phase. The output of the DACs 901, 903 are then up-converted by the mixers 911, 913 with LO signals that have a 180° offset from one another, creating yet another 180° inversion of the signals with respect to one another. This brings the baseband signals of Channel Zero and Channel Two in phase and the first harmonic of the images out of phase. Accordingly, the first harmonics of the images cancel when summed at the output of the mixers 911, 913, while the signals of interest sum together at the output of the mixers 911, 913.

Looking now at the relative phases of the signals that pass through Channel One and Channel Three, those skilled in the art will understand that the transform provided by the PST will cause a first phase shift of −90° to the signal provided to DAC 903 and a phase shift of −270° to the signal provided to DAC 909. However, as noted above, the operation of the PST is such that the negative frequencies experience a shift in the opposite direction from that experienced by the positive frequencies. In the case of a 180° shift, the direction of the rotation doesn't matter, since −180° is the same as 180°. Nonetheless, for Channel One with respect to Channel Three, the phase shift that is applied by the PST is 180°. Accordingly, the sum at the output of the DACs 903, 909 provided by summer 943 is essentially the same as was the case for the sum at the output of Channel Zero and Channel Two. The quadrature shift is only relevant when the outputs of the two summers 941, 943 are summed in the summer 945. At that point the first harmonic images generated by the DACs 901, 903, 907, 909 have all been cancelled by the first summers 941, 943. In addition, all of the odd higher order products will have been suppressed (with the amount of the suppression depending upon the balance between the channels).

Figure 11:
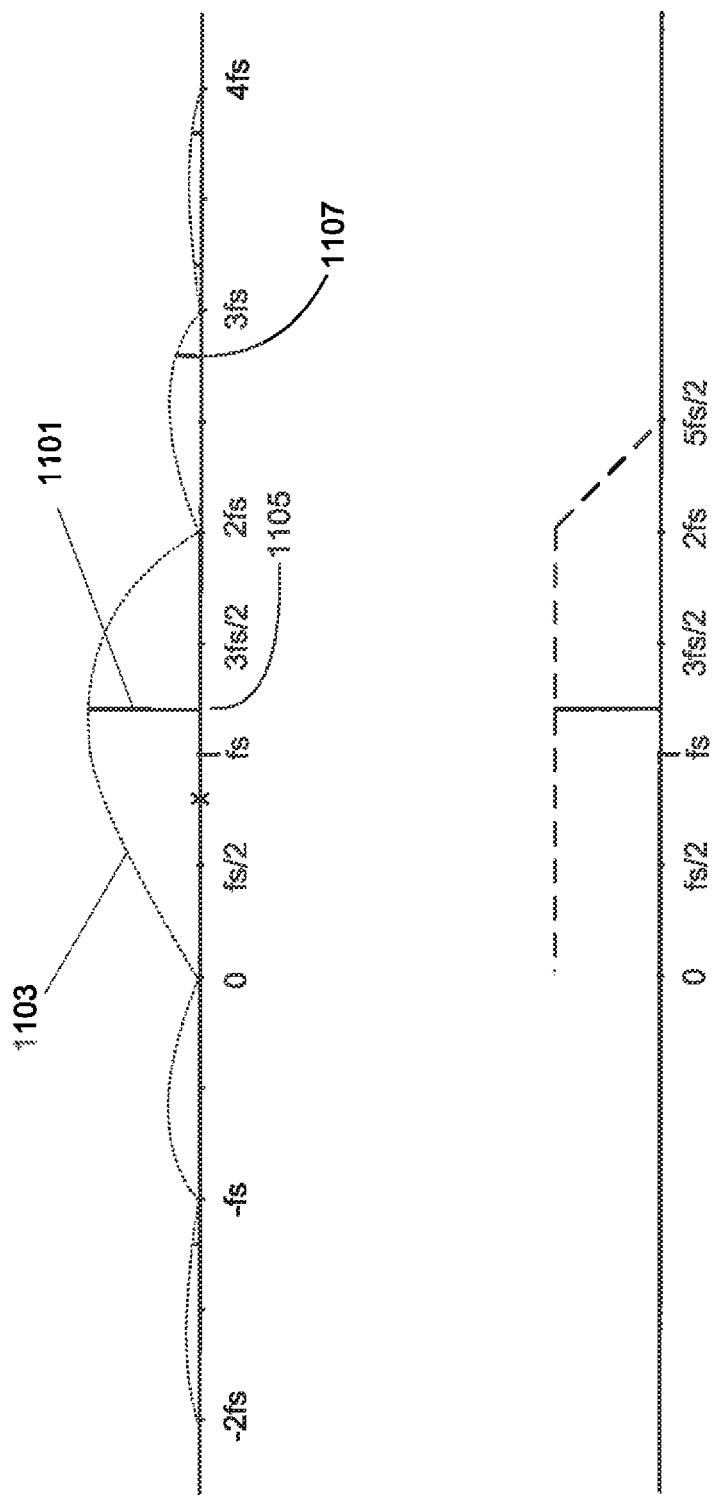
FIG. 11 shows the frequency spectrum of the output of the final summer of FIG. 10.

The result of the sum performed by the summer 945 is that the LSB of the desired signal at $f_s$ will be in phase and the thus survive, but the USB will be out of phase and thus be suppressed. The frequency spectrum of the output of the final summer 945 is shown in FIG. 11. It can be seen that with a multiplicity of DACs (more than 2), higher order images are cancelled in addition to the suppression of the undesired USB 1105. Thus, the desired signal 1101 need not be confined to only the lower frequencies falling inside the first Nyquist zone (below $f_s/2$). Rather, signals at higher frequencies exceeding the first Nyquist zone (i.e., above $f_s/2$ and, with the spectrum located in higher Nyquist zones) can be used, thus a wider frequency range can be covered with the method and apparatus disclosed herein. FIG. 11 shows that the nearest image 1107 is nearly two octaves below the desired signal 1101. Accordingly, a more relaxed RF filter (e.g. a lower order low pass filter can be used instead of a higher order bandpass filter as is desirable when fewer channels are provided).

In addition, the envelope 1103 is skewed toward the LSB 1101 to provide a flatter response near the desired signal 1101.

Full Circle Four-Array RF DAC with Reduced Number of Mixers

Figure 10:
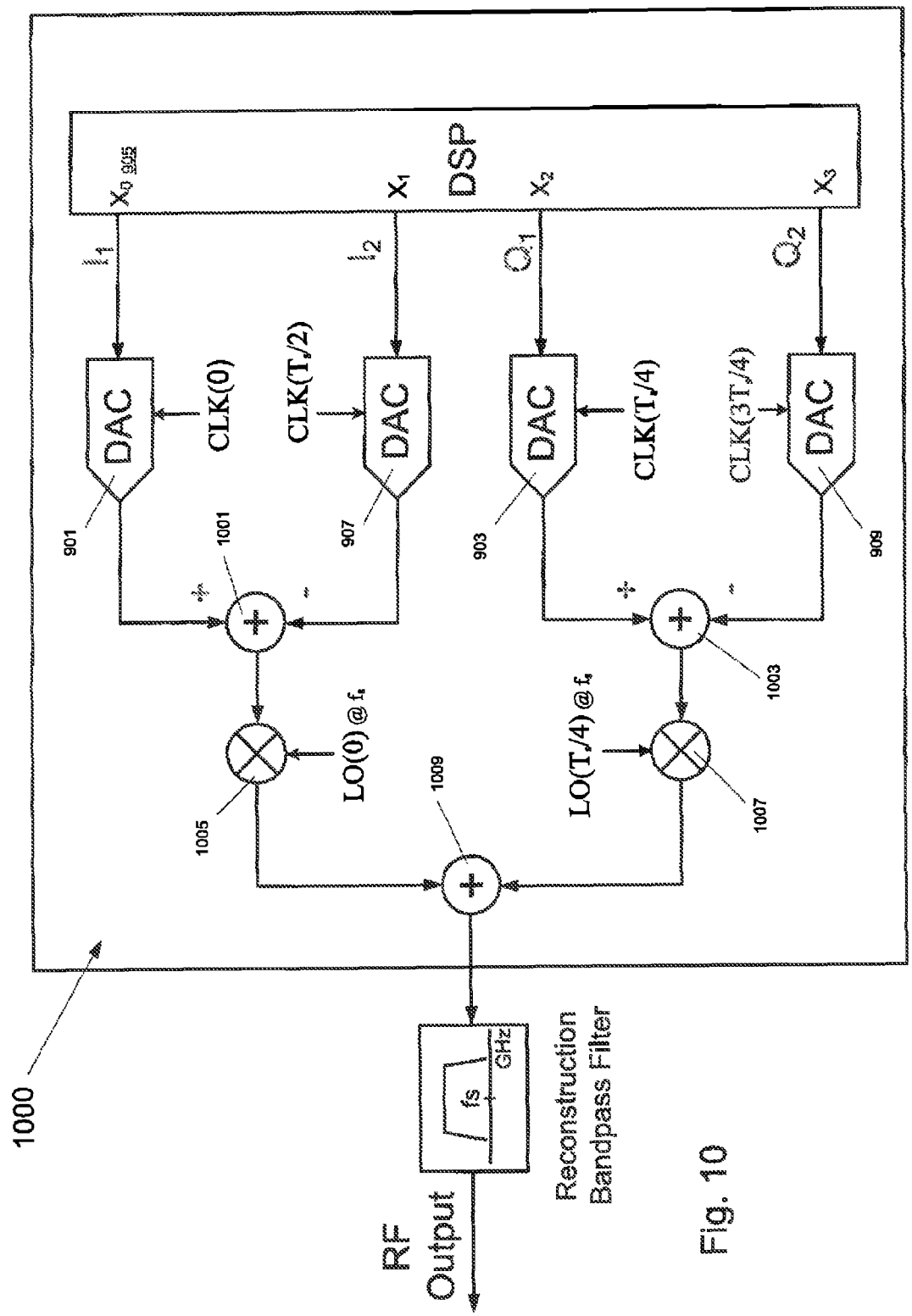
FIG. 10 shows an embodiment of the full circle four-array RF DAC configured to reduce the number of mixers.

FIG. 10 shows an embodiment of the full circle four-array RF DAC configured to reduce the number of mixers. By summing those channels that are offset by 180° before up-converting, a single mixer 1001 can be used to up-convert the output of two DACs 901, 903. Up to the output of the DACs 901, 903, 907, 909 the operation and structure of the embodiment of FIG. 10 is identical to that of FIG. 9. However, the output of the DAC 901 of Channel Zero is subtracted by summer 1001 from the output of DAC 907 of Channel Two. Likewise, the output of the DAC 903 of Channel One is subtracted by summer 1003 from the output of DAC 909 of Channel Three. Since the up-conversion provides an inversion in Channels One and Three, the outputs of the DACs 901 and 907 have to be subtracted rather than summed. Likewise the outputs of the DACs 903 and 909 have to be subtracted by summer 1007. The outputs of the two summers 1001, 1003 are then up-converted by the mixers 1005, 1007 and summed in summer 1009. The LO signal of the first up-converter 1005 is in quadrature with the second up-converter 1007.

Full Circle N-Array RF DAC System with Reduced Number of Mixers

The reduction in the number of mixers can be generalized for a full circle N-array, such as the embodiment shown in FIG. 7 or FIG. 8 when N is an even number. In such embodiments, each complementary pair of channels (mutually 180° out of phase) can be first subtracted at the output of the DAC. The difference of the channels can then be up-converted. Thus, the number of mixers can be reduced by a factor of two.

Full Circle Four-Array RF DAC with Channel Zero Lagging Channel One

Figure 12:
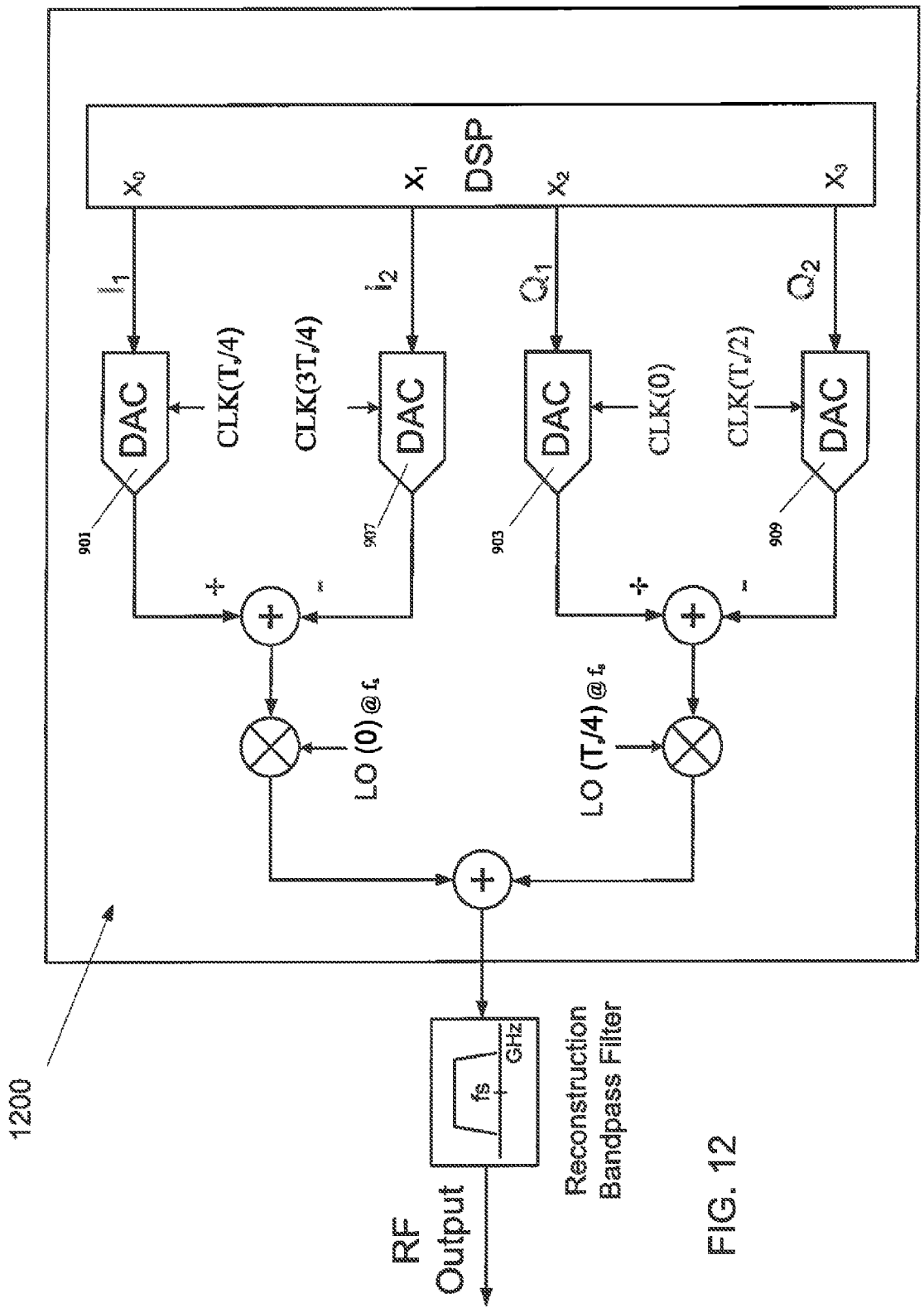
FIG. 12 illustrates a full circle four-array RF DAC 1200 in which Channel Zero lags Channel One.

FIG. 12 illustrates a full circle four-array RF DAC 1200 in which Channel Zero lags Channel One. In the full circle four-array RF DAC 1200, the sample clock signal applied to the DAC 901 of Channel Zero lags the sample clock of Channel One by 90° (delayed by $T_s/4$). As shown in FIG. 12, the sample clock signal applied to the DAC 903 of Channel One is the phase reference for the system. The sample clock signal applied to the DAC 907 of Channel Two has a relative phase of −270° (delayed by $3T_s/4$) and the sample clock signal applied to the DAC of Channel Three has a relative phase of −180° (delayed by $T_s/2$). As seen in FIG. 12, the LO clock coupled to the mixer 1005 has a phase of zero with respect to the sample clock signal applied to the DAC 903. The LO clock coupled to the mixer 1007 has a phase of −90° with respect to the sample clock signal applied to the DAC 903. The result is shown in FIG. 13a, which shows that the LSB 1301 survives, while the USB is suppressed (as shown by an "x" 1305). The closest undesirable image 1307 occurs just above −$f_s$. In addition, the envelope 1309 is skewed toward the LSB. FIG. 13b shows a filter response 1311 and the result of the filter.

Octal RF DAC

Figure 13:
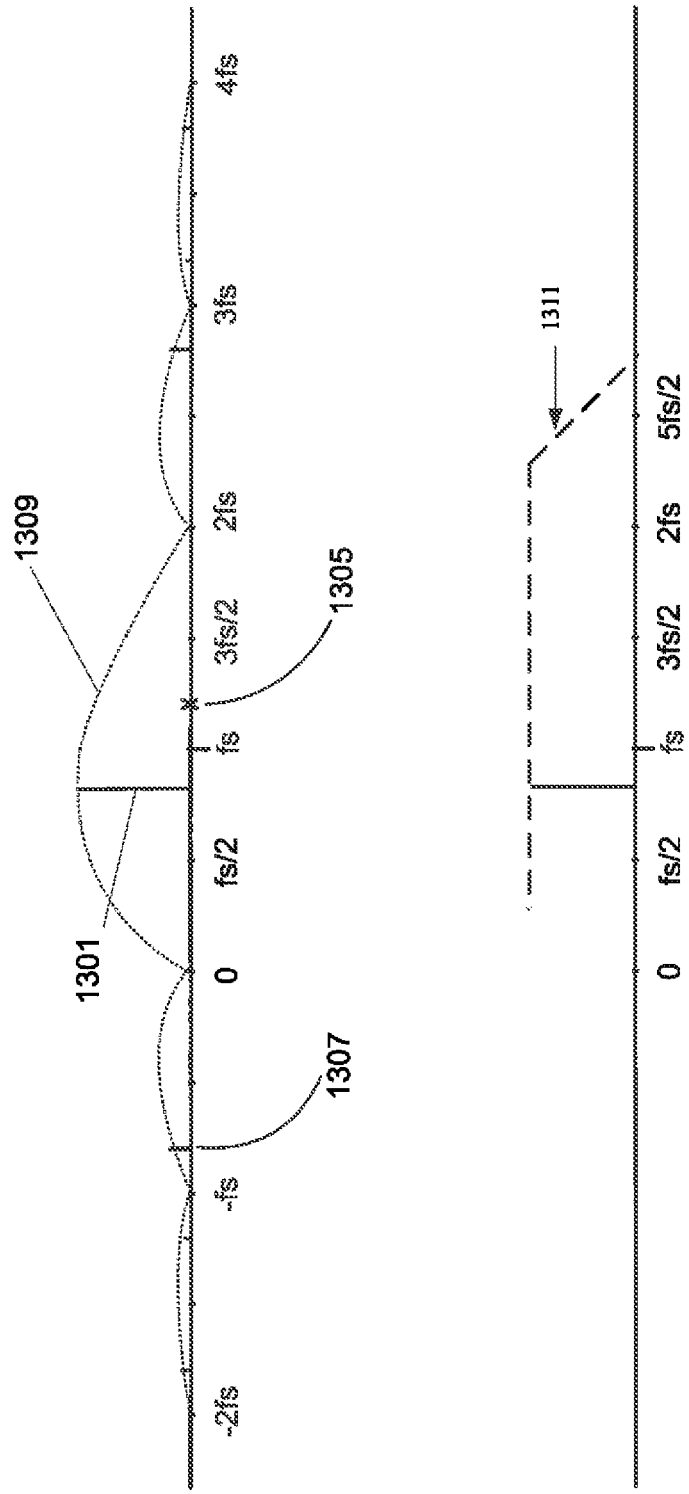
FIG. 13a shows that the LSB survives, while the USB is suppressed by the embodiment of FIG. 12.
FIG. 13b shows a filter response and the result of the filter at the output of the embodiment of FIG. 12.

A review of the spectrum shown in FIG. 11 and FIG. 13 shows that by properly orienting the phase of the sample clock, the skew of the envelope can be manipulated to be either skewed toward the LSB or USB. To generate two or more independent LSB and USB signals, a DSP (such as the DSP 905 of FIG. 5) can perform a PST transformation of each component of a linear combination of components either clock-wise or counterclockwise, according to their respective output sidebands.

Figure 14:
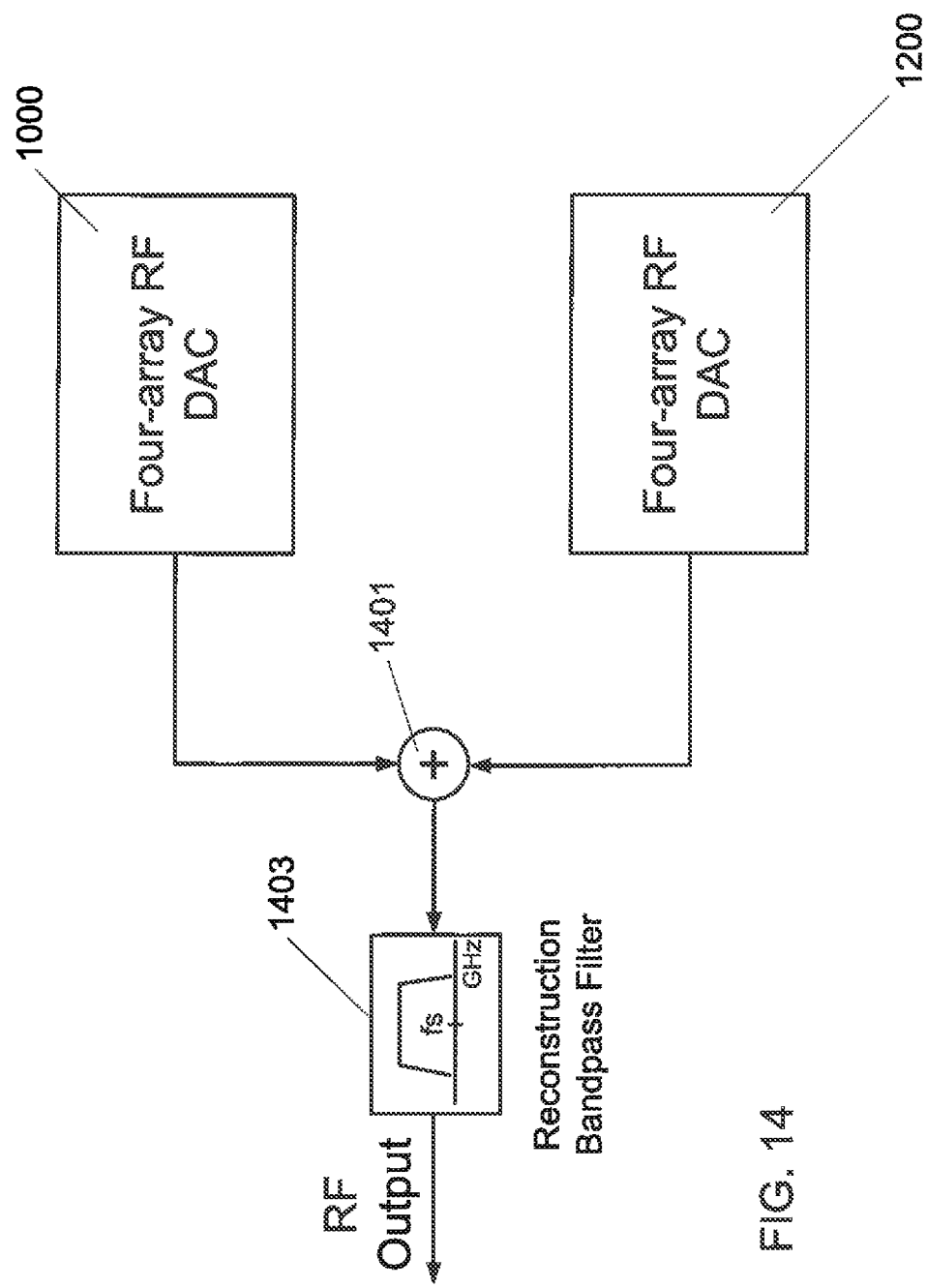
FIG. 14 shows an embodiment of the disclosed method and apparatus that takes advantage of a combination two four-array RF DACs.

FIG. 14 shows an embodiment of the disclosed method and apparatus that takes advantage of a combination two four-array RF DACs. The envelope skew shown in FIG. 11 and provided by the four-array RF DACs 1000 shown in FIG. 10 is combined with the envelope skew shown in FIG. 13a and provided by the four-array RE DAC 1200 shown in FIG. 12 to form a composite signal that provides a flatter response than either one of the four-array RF DAC can provide by itself. The output of the two four-array RF DACs 1000, 1200 are summed by a summer 1401. A reconstruction bandpass filter 1403 is provided to clean up any remaining images that might otherwise be problematic.

Harmonic Full Circle 3-Array RE DAC with $2^{nd}$ Harmonic LO

Figure 15:
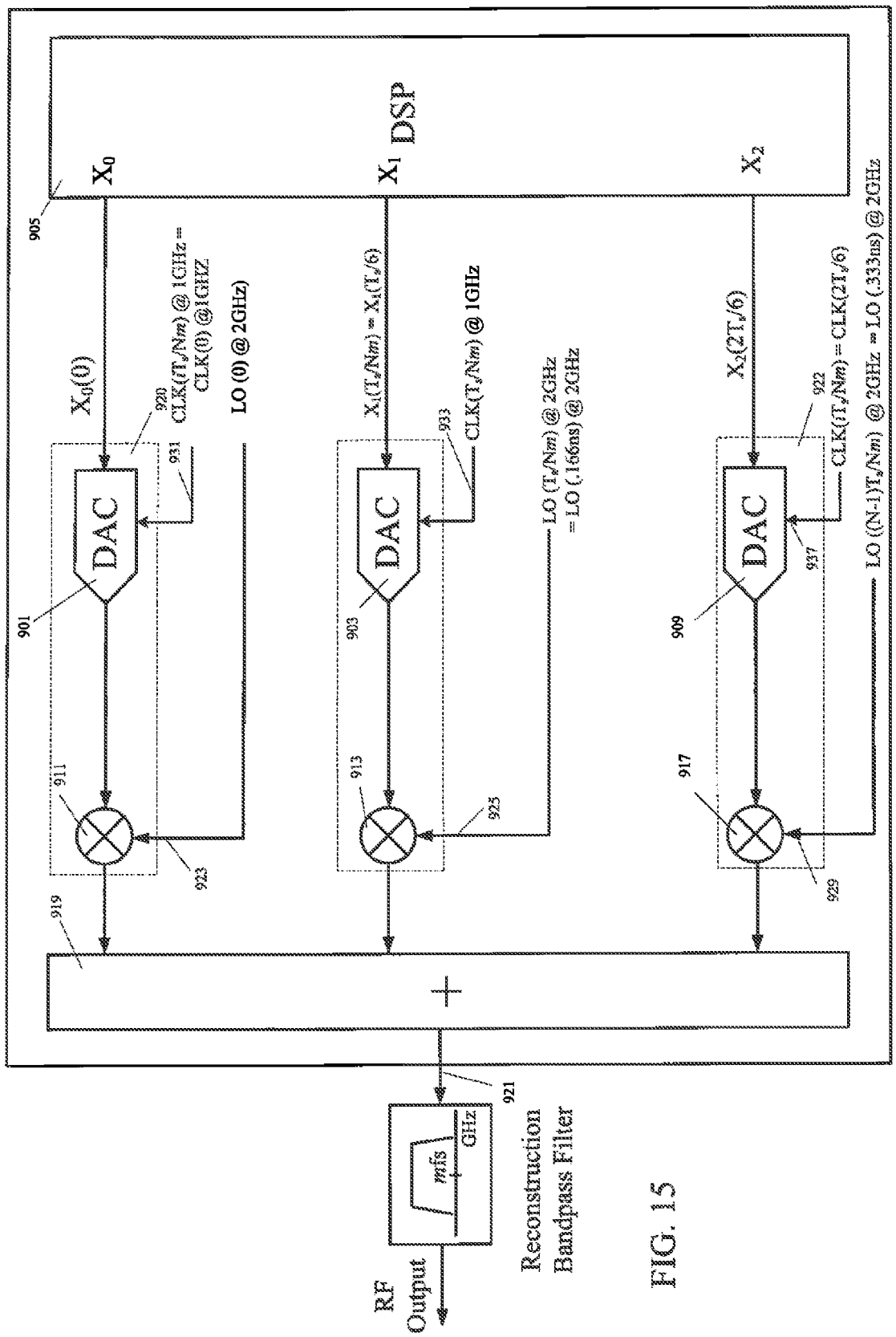
FIG. 15 shows a full circle 3-array RF DAC with a second harmonic LO signal.

FIG. 15 shows a full circle 3-array RF DAC with a second harmonic LO Accordingly m=2 and N=3, therefore, mN=6. Furthermore, $f_s$=1 GHz, therefore, $T_s$=1 ns. Therefore, for this example, which can be derived from the harmonic full circle N-array RF DAC shown in FIG. 8, the baseband signal X is transformed by the PST {X, θ°}, where θ°=−i360°/N=−i120°, for the $i^{th}$ channel. For Channel Zero, θ°=0, for Channel One, θ°=−120° and for Channel Two, θ°=−240°. The phase shift/delay $\tau_i$ to be applied to the sample clock signals 931, 933, 937 is $\tau_i$=i$T_s$/mN. For the sample clock signal of Channel Zero, the delay is 0 ns, for the sample clock signal of Channel One, the delay is 1 ns/6, and for the sample clock signal of Channel Two, the delay is 2 ns/6. The sample clock signals are all run at 1 GHz. The sample times for each sample of the digital sample stream for Channel One is 1 ns/6 and for the sample times of Channel Two, 2 ns/6. The LO signal 923 for Channel Zero is a 2 GHz signal with no relative delay. The LO signal 925 is a 2 GHz signal with a delay of 1 ns/6 which is equal to −120° at 2 GHz. The LO signal 929 is a 2 GHz signal with a delay of (2/6) ns which is equal to −240° at 2 GHz. This embodiment results in the LSB surviving and the USB being suppressed. In addition, the envelope of the output RF signal is skewed toward the USB.

QAM Modulation

The disclosed method and apparatus can be adapted to perform quadrature modulation (such as quadrature amplitude modulation, commonly referred to as QAM modulation). Initially, the use of the disclosed method and apparatus to perform quadrature modulation will be discussed with respect to the embodiment of FIG. 2.

The following is a description of the QAM in particular, but it will be clear to those skilled in the art that this is merely a particular example of quadrature modulation used as an example for clarity.

In order to perform quadrature modulation, QAM symbols are received or generated by the DSP 205. Each QAM symbol has an in-phase (I) value and a quadrature-phase (Q) value. A constellation of symbols can be generated from the combinations of the I and Q values. For example, if the I and Q values are confined to only 1 and −1, then there are four QAM symbols that can be generated. However, if the I and Q values can take on any one of 4 values then 16 unique QAM symbols can be generated. In accordance with one embodiment of the disclosed method and apparatus, the DSP 205 generates a first baseband signal and second baseband signal from the stream of I and Q values. It will be understood that the stream of I values will represent one baseband signal and the stream of Q values will represent a second baseband signal.

The disclosed method and apparatus can also accomplish the most general case of synthesizing an arbitrary RF signal. It is well known in the art that a band-limited signal can be represented as a band-pass signal in the form of a quadrature modulated signal I(t)cos ωt−Q(t)sin ωt, where the I(t) and Q(t) are baseband signals independent of each other, which are modulated onto the RF carrier of angular frequency ω. It can be shown that in this case, the digital baseband signals $X_i$ can be expressed as a linear combination of digital representation (digital streams) of I and Q signals and their respective PST transformations. In embodiments of the disclosed method and apparatus accomplishing the quadrature IQ modulator function, the following relationship between the PST transforms and the input I and Q signals is obtained by DSP 205, and (ignoring the coefficient of proportionality of ½) is expressed as follows:

$X0 = I\{0\} - Q\{-90°\} + I\{0\} + Q\{-90°\}$ $X1 = I\{-\theta\} - Q\{-90°-\theta\} + I\{+\theta\} + Q\{-90°+\theta\}$ $X2 = I\{-2\theta\} - Q\{-90°-2\theta\} + I\{+2\theta\} + Q\{-90°+2\theta\}$

. . .

$Xi = I\{-i\theta\} - Q\{-90°-i\theta\} + I\{+i\theta\} + Q\{-90°+i\theta\}$

. . .

$XN-1 = I\{-(N-1)\theta\} - Q\{-90°-(N-1)\theta\} + I\{+(N-1)\theta\} + Q\{-90°+(N-1)\theta\}$ The first two columns in the array (the I{−iθ}−Q{−90°−iθ} terms, which phases are rotated in the clock-wise direction, starting from i=0 through N−1) will yield the LSB RF signal, and the second two columns (the I{+iθ}+Q{−90°+iθ} terms, which phases are rotated in the counter-clock-wise direction) will yield the USB signal at the output, such that the composite signal (sum signal LSB+USB) represents the desired quadrature modulated RF output signal.

The first equation above (including the coefficient ½) is identical to I, i.e. X0≡I. In the case of a dual (or quad) band-pass DAC, when θ=−90°, the second equation above degenerates to a case of X1≡Q, because the I-terms cancel and the Q-terms add, as follows: substituting θ=−90° and adding the factor of proportionality=>2·X1=I{−90°}−Q{−90°−90°}+I{+90°}+Q{−90°+90°}=I{−90°}−Q{−180°}−I{−90°}+Q{0°}=−Q{180°}+Q{0°}=+Q{0°}+Q{0°}=2·Q (the property of the PST transform that the sign is inverted when the phase is changed by 180° has been used in this identity).

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower ease is intended or required in instances where such broadening phrases may be absent. The use of the term "module" does not imply that the components or functionality described or claimed as part of the module arc all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method, comprising:
    receiving a first stream of samples to a sample input of a first digital to analog converter (DAC) for setting an output level at an output of the first DAC based upon a value of the samples and at a time indicated by a first sample clock signal having a sample frequency, fs, applied to a clock input of the first DAC;
    applying the first sample clock signal to a local oscillator (LO) input of a first up-converter and receiving an output signal from the output of the first DAC at a signal input of the first up-converter;
    receiving a second stream of samples to a sample input of a second DAC, the second stream of samples having a sample time coincident with the timing of a second sample clock signal applied to a clock input of the second DAC, the second sample clock signal having the same sample frequency as the first sample clock signal and a quadrature offset in time from the first sample clock signal;
    applying the second sample clock signal to an LO input of a second up-converter and receiving an output signal from an output of the second DAC at a signal input of the second up-converter; and
    summing an output of the first up-converter and an output of the second up-converter to generate a radio frequency (RF) output signal in which at least one of a lower sideband (LSB), an upper sideband (USB), and one or more spectral images are suppressed.

2. The method of claim 1, wherein the first stream of samples has a sample time coincident with a timing of a sample clock providing the first and second sample clock signals.

3. The method of claim 1, wherein the first and second streams of samples are received from a digital signal processor after performance of a phase shifting transform on a digital sample stream representative of a baseband signal.

4. The method of claim 3, wherein sampling performed to generate the first and second streams of samples is time aligned.

5. The method of claim 4, wherein the time alignment is achieved by performing sampling to generate the second stream of samples with a delay relative to the sampling performed to generate the first stream of samples.

6. The method of claim 3, wherein a phase of the baseband signal to be transformed by performance of the phase shifting transform is 0 degrees for the first stream of samples.

7. The method of claim 6, wherein a phase of the baseband signal to be transformed by performance of the phase shifting transform is −90 degrees for the second stream of samples.

8. The method of claim 3, wherein a phase of the baseband signal to be transformed by performance of the phase shifting transform is 90 degrees for the second stream of samples.

9. The method of claim 8, wherein the quadrature offset in time comprises a 90 degree phase shift of the second sample clock signal.

10. The method of claim 9, wherein the RF output signal comprises a suppressed USB and a sin c envelope skewed towards the LSB.

11. The method of claim 1, further comprising modulating the output of the first DAC at the first up-converter with a first LO signal and modulating the output of the second DAC at the second up-converter with a second LO signal.

12. The method of claim 11, wherein the second LO signal lags the first LO signal by one-quarter of a sample clock period.

* * * * *